United States Patent
Kriss et al.

(10) Patent No.: US 12,332,149 B2
(45) Date of Patent: *Jun. 17, 2025

(54) MANAGING THE EFFECTIVENESS OF REPAIRS IN REFRIGERATION ASSETS

(71) Applicant: KLATU Networks, LLC, Poulsbo, WA (US)

(72) Inventors: Richard Kriss, Poulsbo, WA (US); Daniel Simpson, San Diego, CA (US); Christopher Exline, Escondido, CA (US); Peter Christopher Larsson, San Diego, CA (US)

(73) Assignee: KLATU Networks, Inc., Poulsbo, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/520,533

(22) Filed: Nov. 27, 2023

(65) Prior Publication Data

US 2024/0094095 A1 Mar. 21, 2024

Related U.S. Application Data

(63) Continuation of application No. 15/862,627, filed on Jan. 4, 2018, now Pat. No. 11,828,678, which is a (Continued)

(51) Int. Cl.
*F24F 11/56* (2018.01)
*F24F 1/0071* (2019.01)
(Continued)

(52) U.S. Cl.
CPC ............ *G01M 99/005* (2013.01); *F24F 8/10* (2021.01); *F24F 11/38* (2018.01); *F24F 11/56* (2018.01);
(Continued)

(58) Field of Classification Search
CPC .......... G01M 99/005; F24F 8/10; F24F 11/38; F24F 11/56; F24F 1/0071; F24F 8/30;
(Continued)

(56) References Cited

U.S. PATENT DOCUMENTS

| | | |
|---|---|---|
| 4,325,223 A | 4/1982 | Cantley |
| 7,908,875 B2 | 3/2011 | Smith |

(Continued)

FOREIGN PATENT DOCUMENTS

| | | |
|---|---|---|
| JP | 2001099462 A | 4/2001 |
| JP | 2005282947 A | 10/2005 |

(Continued)

OTHER PUBLICATIONS

Corresponding EP Appln. No. 14871725.5. Extended EP Search Report (Sep. 20, 2017).

(Continued)

*Primary Examiner* — Mohammad K Islam
(74) *Attorney, Agent, or Firm* — Loza & Loza, LLP; Anthony Smyth

(57) ABSTRACT

A method and an apparatus are provided that may be applicable to refrigeration assets, including refrigeration plants and cold-storage facilities comprising large numbers of refrigeration assets. The performance of refrigerators and refrigeration devices may be monitored based on temperature and electrical current and other measurements known or deemed to be correlated with refrigeration performance. Refrigeration assets in need of repair may be identified and a repair process may be specified, classified, managed and optimized. The immediate effectiveness and long-term persistence of repairs may be determined over time. The refrigeration assets may be classified according to reliability, performance, make, model and manufacturer. The effectiveness of repairs may be classified based on measured perfor- (Continued)

mance results following repairs. Service providers, including organizations, companies or individuals providing repair and other services, may be evaluated for the effectiveness and persistence of repair results using benchmarks and other quantitative evaluation methods.

18 Claims, 17 Drawing Sheets

Related U.S. Application Data continuation-in-part of application No. 14/579,973, filed on Dec. 22, 2014, now abandoned, and a continuation-in-part of application No. 14/275,771, filed on May 12, 2014, now Pat. No. 10,337,964, which is a continuation of application No. 13/048,698, filed on Mar. 15, 2011, now Pat. No. 8,725,455.

(60) Provisional application No. 62/032,464, filed on Aug. 1, 2014, provisional application No. 61/919,642, filed on Dec. 20, 2013, provisional application No. 61/314,014, filed on Mar. 15, 2010.

(51) Int. Cl.
*F24F 8/10* (2021.01)
*F24F 8/30* (2021.01)
*F24F 11/38* (2018.01)
*G01M 99/00* (2011.01)
*G01N 29/00* (2006.01)
*G01N 29/14* (2006.01)
*G01R 21/00* (2006.01)
*G01R 21/06* (2006.01)

(52) U.S. Cl.
CPC .............. *G01N 29/00* (2013.01); *G01N 29/14* (2013.01); *G01R 21/00* (2013.01); *F24F 1/0071* (2019.02); *F24F 8/30* (2021.01); *G01R 21/06* (2013.01)

(58) Field of Classification Search
CPC ......... F24F 11/46; G01N 29/00; G01N 29/14; G01R 21/00; G01R 21/06; F25B 49/022; F25B 2600/0251; F25B 2700/21152; F25B 2600/02
See application file for complete search history.

(56) References Cited

U.S. PATENT DOCUMENTS

| | | |
|---|---|---|
| 8,599,008 B2 | 12/2013 | Watson et al. |
| 2004/0210419 A1* | 10/2004 | Wiebe .................. F25B 49/005 |
| | | 702/182 |
| 2004/0236494 A1* | 11/2004 | DeBotton ............. G01M 15/12 |
| | | 701/111 |
| 2006/0032606 A1 | 2/2006 | Thybo et al. |
| 2007/0060038 A1 | 3/2007 | Yamashita et al. |
| 2007/0156373 A1 | 7/2007 | Yamashita et al. |
| 2007/0220907 A1 | 9/2007 | Ehlers |
| 2007/0227161 A1* | 10/2007 | Boer ...................... F25D 29/00 |
| | | 62/172 |
| 2007/0295015 A1 | 12/2007 | Bailey et al. |
| 2008/0066474 A1* | 3/2008 | Porter ................... F04D 27/001 |
| | | 62/127 |
| 2009/0293479 A1* | 12/2009 | Durso .................... F01K 25/06 |
| | | 60/671 |
| 2010/0121609 A1 | 5/2010 | Gorinevsky |
| 2011/0224947 A1 | 9/2011 | Kriss |
| 2012/0019378 A1 | 1/2012 | Watson et al. |
| 2012/0271576 A1 | 10/2012 | Kamel et al. |
| 2013/0311437 A1 | 11/2013 | Stluka et al. |
| 2014/0074730 A1 | 3/2014 | Arensmeier et al. |

FOREIGN PATENT DOCUMENTS

| | | |
|---|---|---|
| KR | 1020040088629 | 10/2004 |
| KR | 1020080040073 | 5/2008 |

OTHER PUBLICATIONS

PCT/US2014/071979. Int'l Search Report & Written Opinion (May 10, 2015), 8 pp.
Corresponding European Appln. Ser. No. 14871727.5. Office Action (Jun. 17, 2017).
Corresponding European Appln. Ser. No. 14871727.5. Office Action (May 12, 2020).
Corresponding Canadian Appln. Ser. No. 2,933,904. Office Action (Apr. 12, 2022).
Corresponding Canadian Appln. Ser. No. 2,933,904. Office Action (Feb. 3, 2021).
Corresponding Canadian Appln. Ser. No. 2,933,904. Office Action (Aug. 27, 2021).

* cited by examiner

MANAGING THE EFFECTIVENESS OF REPAIRS IN REFRIGERATION ASSETS

CROSS-REFERENCE TO RELATED APPLICATIONS

This application is a continuation of U.S. patent application Ser. No. 15/862,627 filed on Jan. 4, 2018, which is a continuation-in-part of now-abandoned U.S. patent application Ser. No. 14/579,973 filed on Dec. 22, 2014, which claims priority to and the benefit of U.S. provisional patent application No. 61/919,642 filed on Dec. 20, 2013, and U.S. provisional patent application No. 62/032,464 filed on Aug. 1, 2014 and, further, U.S. patent application Ser. No. 15/862,627 is a continuation-in-part of U.S. patent application Ser. No. 14/275,771 filed on May 12, 2014 which issued as U.S. Pat. No. 10,337,964 on Jul. 2, 2019, and which is a continuation of U.S. patent application Ser. No. 13/048,698, filed Mar. 15, 2011, which was issued as U.S. Pat. No. 8,725,455 on May 13, 2014, and which claimed priority from U.S. Provisional Patent Application No. 61/314,014 filed Mar. 15, 2010 the entire content of all the above applications are incorporated herein by reference.

TECHNICAL FIELD

The present invention relates generally to management of refrigeration assets and more particularly to remote management of operational, monitoring, maintenance and repair processes associated with installations comprising large numbers of refrigeration assets.

BACKGROUND

Refrigeration equipment tends to suffer a loss of operating efficiency over time due to manufacturing defects, mechanical degradation, adverse environmental factors, deferred maintenance or simple misconfiguration. Research in Life Science applications indicates that 30-50% of all commercial refrigeration equipment operates out of specification with 10-15% showing signs of eminent mechanical failure at any time, even where the commercial refrigeration equipment is well-maintained.

Determining the state-of-health for a refrigeration system is not easy. Current industry best practices have not changed in 50 years and often rely on a fail-and-fix repair model, whereby repairs are applied only after the equipment fails. This approach results in the highest possible repair costs for assets that fail, decreasing reliability for assets that have not yet failed, and sub-optimal management of assets in terms of energy, maintenance costs and risk factors such as mechanical failure.

In an attempt to mitigate these cost and risk factors, periodic and costly preventive maintenance inspections are often scheduled in an attempt to determine a-priori whether a refrigeration system has an operational deficiency and requires additional maintenance. These inspections are labor intensive, costly and most often ineffective. Inspections are costly because an entire population of refrigeration assets must be inspected even though only a percentage might require repair or maintenance. Inspections are ineffective because most refrigeration problems are difficult to detect without continuous real-time monitoring and analytical tools not common or affordable in the industry today.

For lack of an affordable option to detect refrigeration problems, some operators adopt the costly mitigation strategy of replacement of refrigeration assets after five years of service, even though there may be nothing wrong with some refrigeration assets.

Ultra-Low Temperature (ULT) freezers commonly deployed in Life Science applications, for example, operate at extremely low temperatures (−80° C.). Each ULT may consume the equivalent energy of an entire house, and can account for 25-30% of all electricity consumed in many university research and pharmaceutical manufacturing facilities. This is confirmed by US Government data indicating that Life Science research and manufacturing facilities consume 2× to 8× more energy than commercial office buildings. In addition to wasted energy, the unexpected failure of a ULT Freezer in a Life Science application can result in the catastrophic loss of high-value, mission critical research specimens or pharmaceuticals.

The refrigeration and air conditioning repair industry produces more than $2.5 billion in revenues annually, employs more than 38,000 repair technicians who continue to use "fail and fix" repair methods that have been substantially unchanged for 50 or more years. The refrigeration industry is also coming under increased regulation by the governmental agencies through programs such as the Energy Star™ program in the United States, which seek to drive adoption new energy technologies into the market.

One of the largest sources of wasted energy in existing refrigeration equipment can be attributed to diminished state of health and repair, which are highly correlated with energy efficiency. For lack of affordable tools, many repairs are not effective or persistent over time, with the common result that 20%-50% of all energy consumed by poor performing equipment is wasted. More often than not, this waste is due to inadequate diagnostics systems, and poor skills and repair techniques of the Service Provider. Therefore there is a need for improved asset management systems applicable to refrigeration assets.

SUMMARY

Certain aspects of the present disclosure provided improved asset management systems and technology that are based on proactive predict and prevent methods for anomaly detection, repair and post-repair monitoring of assets. Certain aspects are applicable to refrigeration systems and assets including individual refrigeration assets, refrigeration farms comprising large numbers of refrigeration assets, and/or walk-in rooms which use one or more refrigeration systems, which may be collectively referred to as refrigeration systems or refrigeration assets. Systems and methods are provided that can monitor performance of refrigerators and refrigeration assets, determine and select which refrigeration assets are in need of reconfiguration and/or repair. The repair process may be monitored, and the effectiveness of repairs may be determined after repairs are completed. Asset management technologies, systems and methods are provided that may be applicable to refrigeration assets so that the status, health and energy efficiency of these assets can be determined and monitored over time. These systems and methods may be used to support corporate or government mandated programs for reduced energy consumption and to calculate incentives and rebates attributable to energy savings based on specific utility provided criteria for calculating the persistence and amount of energy savings following repairs According to certain aspects, a repair process may be controlled using a feedback loop by classifying, benchmarking, managing and optimizing the repair process. The effectiveness and persistence of repairs may be determined over time to establish the status and/or efficacy of a repair independently of the diagnosis made by a repair technician. The refrigeration assets may be classified according to size, type, design, in situ environment, configuration, reliability, performance, make, model and manufacturer. The effectiveness of configuration changes or repairs may be classified based on measured performance results following repairs, and service providers, including organizations, companies and/or individuals providing repair and other services, might be similarly evaluated for the effectiveness and persistence of their repair results using benchmarks and other qualitative or quantitative evaluation methods. The evaluation may be based on information derived from federated data, including data obtained from a plurality of sources and operators of large refrigeration systems (i.e. systems having many assets), and each operator may evaluate the information using comparisons of its own assets or in relation to a larger population of comparable assets of which the operator may not be aware or be able to access.

In an aspect of the disclosure, energy usage by refrigeration assets may be estimated. In some instances, energy usage measured or estimated prior to a repair may be used to calculate or estimate energy savings that may be accrued upon successful completion of the repair. In some instances, actual energy usage measurements and/or calculations may be used to forecast the energy savings expected after a repair. The determination of effectiveness and/or persistence of repairs may include a consideration of energy savings over time.

In an aspect of the disclosure, a method, a computer program product, and an apparatus are provided that can monitor refrigeration assets using wired or wirelessly connected sensors, which transmit data to an application server for analysis and benchmarking ("Performance Information"). Data may be processed and measured against time or in reference to predefined benchmarks and/or norms in order to determine relative performance in reference to comparable peers of the assets as defined by query criteria, normalization or filters. The analysis and results may be represented with a visual indication, mathematical or pattern recognition function, including a sine wave or a statistical model, for example. The application server may be accessed through any web browser or web interface, and the user can have a distinct login identification and password.

DETAILED DESCRIPTION

Figure 1:
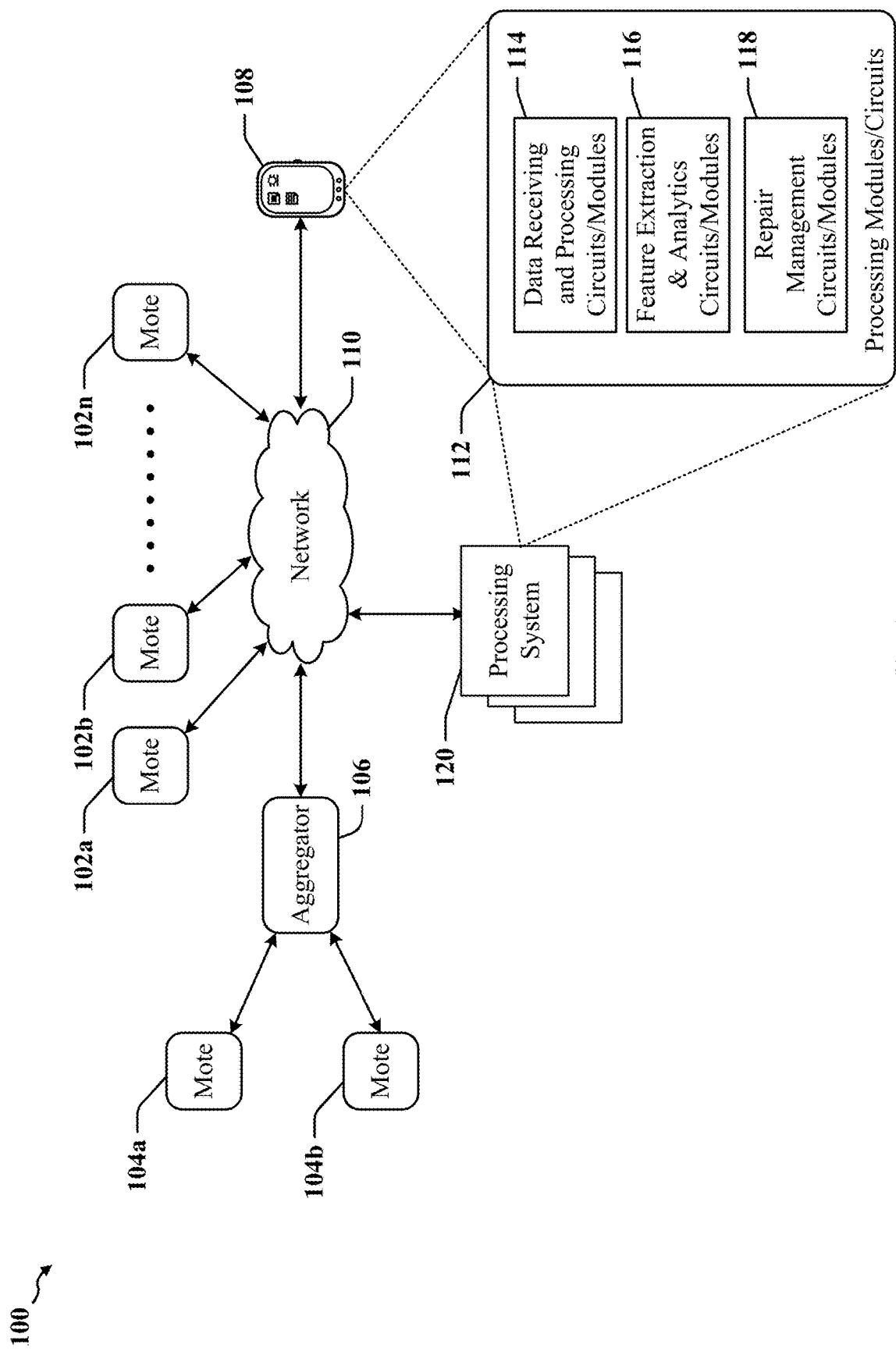
FIG. 1 illustrates a system configured to monitor a plurality of assets equipped with sensors in accordance with certain aspects disclosed herein.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Various aspects of the disclosure relate to systems, apparatus and methods that may be used to monitor, manage, control and report on the operation of equipment that may be deployed locally or remotely and/or in large numbers. To facilitate description of certain aspects, specific details related to refrigeration and/or freezer assets will be given, and it will be understood that the aspects may be practiced without these specific details. In one example, methods, apparatus, and computer program products are described in relation to refrigeration systems and refrigeration assets, including ULT refrigerators and freezers, refrigeration plants and cold-storage facilities comprising large numbers of refrigeration assets. The performance of refrigeration systems and/or refrigeration assets may be monitored based on temperature and electrical current and other measurements known, inferred, deemed, and/or correlated with refrigeration performance. Performance may measure and/or characterize the status, heath, reliability and/or energy usage of a refrigeration asset or refrigeration system. Refrigeration assets in need of repair may be identified and a repair process may be specified, classified, managed locally or remotely, and optimized. The immediate effectiveness and long-term persistence of repairs and energy savings may be determined over time. The refrigeration assets may be classified, scored, and/or rated according to normalized data, design, reliability, performance, make, model and manufacturer. The effectiveness of repairs may be classified based on measured performance results following repairs. The equipment or service providers, including organizations, companies or individuals providing repair and other services, may be evaluated for the effectiveness and persistence of repair results using benchmarks and other qualitative or quantitative evaluation methods.

Certain aspects of the present may be described in relation to a variety of types of refrigeration assets, including refrigeration farms comprising large numbers of refrigeration assets. Systems and methods are described that may be used to monitor and analyze performance of refrigeration assets, and can identify and select refrigeration assets in need of repair. In certain embodiments, a repair process may be specified, scored, classified, managed and optimized. The immediate effectiveness and long-term persistence of repairs and energy savings may be determined over time. The refrigeration assets may be analyzed, evaluated and classified according to type, design, in situ environment and/or configuration, reliability, energy efficiency, access activity, performance, make, model, manufacturer, performance or the identity of the service technician performing the repair, and other logical views.

The effectiveness of repairs and energy savings may be classified based on the measured results following repairs made by service providers, including organizations, companies and/or individuals providing repair and other services.

Certain systems and methods are provided that can determine the status and/or state-of-health of a refrigeration asset, determine the effectiveness and persistence of repairs and energy savings, identify poorly performing refrigeration assets and manage and control repair processes. Systems and methods are provided to monitor refrigeration assets using wired or wireless sensors, which transmit data to an application server for analysis and benchmarking of performance. Data may be processed and measured against time or in reference to predefined benchmarks and/or norms in order to determine relative performance in reference to selected peers as defined by query criteria, normalization, or filters. The analysis and results may be represented with a visual indication, mathematical or pattern recognition function, such as a sine wave or a statistical model. The application server may be accessed through any web browser or web interface, and the user can have a distinct login identification and password.

FIG. 1 is a simplified block diagram 100 illustrating a network of devices that may be deployed to monitor various types of assets. A plurality of networked devices, which may be referred to collectively herein as "Motes 102, 104," may be adapted or configured to sample data produced by one or more sensors, and to transmit the sensor data to a processing system 108, 120. In one example, the processing system 120 may include one or more processing circuits and/or systems that are accessible through a network 110, which may include the Internet. In another example, a mobile computing device 108 may be configured to enable field service personnel to interact with other portions of the processing system 120 and equipment targeted during service calls. The mobile computing device 108 may include one or more wired or wireless transceivers and/or line drivers and receivers that enable the mobile computing device 108 to communicate with certain Motes 102, 106, and the network 110. In some instances, the mobile computing device 108 includes or may be coupled to one or more external sensors that can be used to monitor an asset during field servicing. In some instances, the mobile computing device 108 may interface with a computing system or other intelligent device provided within a managed asset.

The processing system 108, 120 may include modules and/or circuits 112 adapted or configured to communicate with and/or control with the Motes 102, 104. For example, certain circuits and/or modules 114 may be configured to receive and process sensor data sampled by the by the Motes 102, 104, circuits and/or modules 116 configured to process the sensor data to derive sensor metrics used for determining health of assets and changes or differences in health of an asset with respect to peer assets and/or relative to prior states of the asset, and circuits and/or modules 118 configured to track repairs in the context of derived sensor metrics, and to determine the effectiveness and persistence of said repairs by analysis of features in the sensor data before and after the repair.

In the example, certain Motes 102a-102n may communicate with a network 110 using wired or wireless communications technology, while other Motes 104a, 104b may be coupled to an aggregator 106 that collects, processes and/or forwards sensor data from the Motes 104a, 104b. Each of the Motes 102, 104 may sample data from one or more sensors associated with an asset. In some instances, certain Motes 102, 104 may be adapted to sample data from sensors associated with two or more assets.

Figure 2:
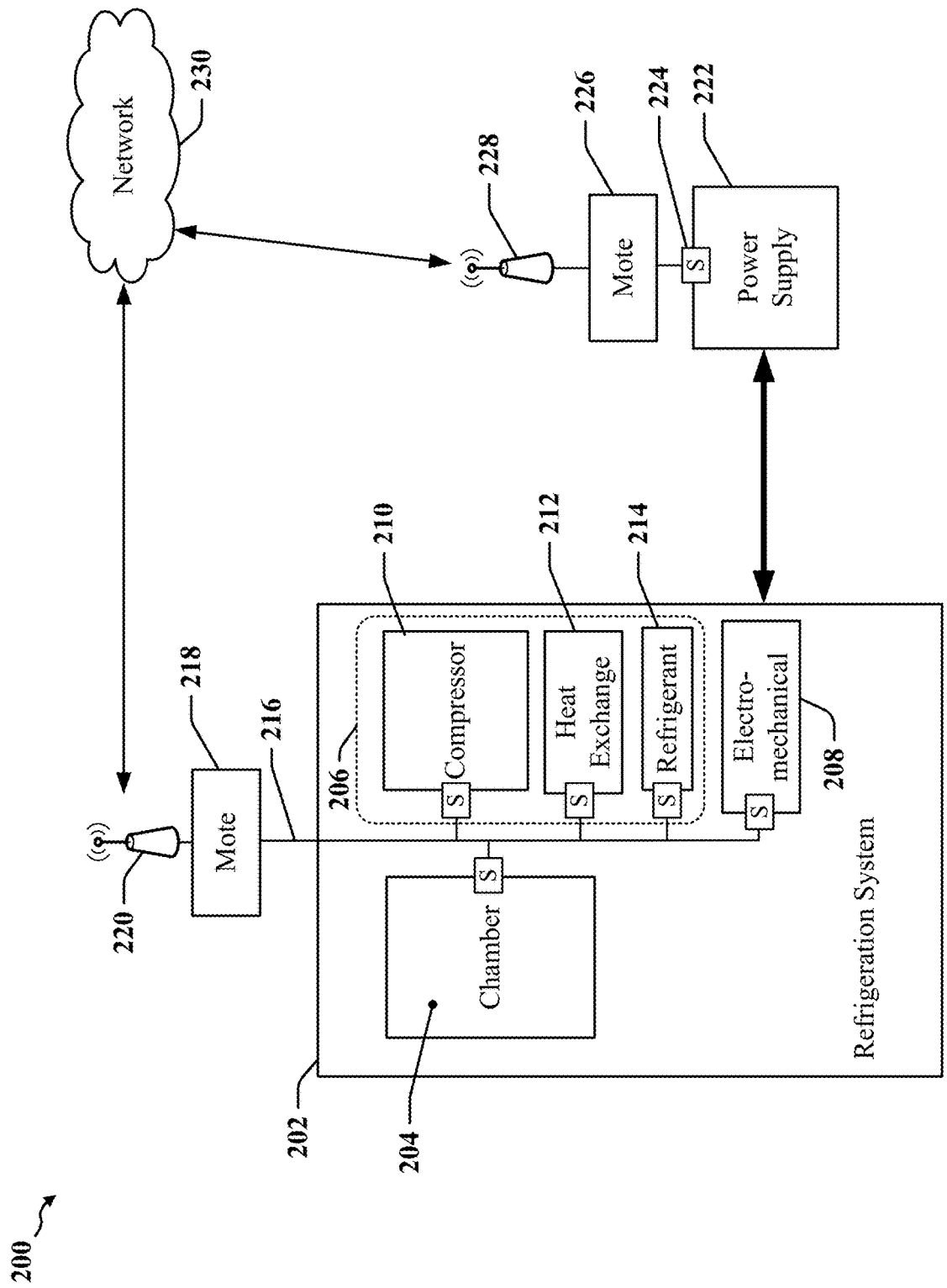
FIG. 2 illustrates a refrigeration system instrumented with sensors and other monitoring circuitry according to certain aspects disclosed herein.

FIG. 2 is a block diagram 200 illustrating a simplified example in which a monitored asset includes a refrigeration system 202. For the purposes of this description, a refrigeration system 202 may comprise one or more of a freezer, refrigerator, storage space or room in which the temperature is controlled in order to maintain contents of a storage space or chamber 204 within a desired or required temperature range. In one example, the refrigeration system 202 may be fitted with sensors (depicted here for convenience as a sensor bus 216) that communicate with a Mote 218 configured to measure and/or monitor environmental conditions, operating conditions, thermodynamic cycles, power supplies, and other systems, characteristics and attributes associated with the refrigeration system 202, based on data sampled from or otherwise provided by the sensors 216. The combination of a Mote 218 and one or more sensors 216 monitored or controlled by the Mote 218 may also be referred to as a smart sensor. In some instances, the sensors 216 include smart sensors that include internal circuits and modules that enable the sensors to communicate with a network 230 directly or through an intermediary device 218 (or aggregator 106).

The sensors 216 may include devices that monitor equipment location, or measure electrical current, voltage, door position, temperature, pressure, mechanical strain, and/or vibrations within or surrounding the refrigeration system 202. The refrigeration system 202 may comprise more than one chamber 204 or other storage space that is maintained at a desired temperature by a refrigeration system 206. In one example, the refrigeration system 206 may include a compressor 210, a heat exchange system 212, a refrigerant circulation 214 and other electro-mechanical components 208.

In some embodiments, a second Mote 226 (or smart sensor) may be provided to monitor power consumption of one or more refrigeration systems or assets 202 using sensors 224 or other instruments. The second Mote 226 may monitor current and/or voltage sensors provided in a distribution panel or in a power supply 222. The second Mote 226 may monitor current and/or voltage sensors associated with powered components of the refrigeration system 202 including, for example, the compressor 210, pumps, valves and other rotating machinery or electromechanical devices 208.

In some instances, the Motes 218, 226 may be implemented using a smart module that has a processing circuit, storage and one or more transceivers operable to connect the Motes 218, 226 to the network 230 continuously, continually, opportunistically or when a network connection is available. One or more of the Motes 218, 226 may operate as data logger that stores various information received or generated by the Motes 218, 226. In some instances, the Motes 218, 226 may be adapted to perform certain data processing tasks on sensor data. In some instances, the Motes 218, 226 may be adapted to participate in and/or remotely manage a repair process.

In some examples, equipment location, analytical measurements and other information may be obtained from other sources, including descriptive, qualitative or quantitative data entered manually at or near the refrigeration system 202, or entered through a networked console, terminal, mobile computing device and communicated through the network 230. In one example, information representing equipment location and/or other manual measurements taken during the service or maintenance of the system may be provided through the mobile computing device 108 illustrated in FIG. 1. Power-related measurements may be directly or indirectly obtained from sensors 216 and/or 224 and energy consumption may be accurately calculated by measuring amperage and voltage periodically or continuously. In some instances, energy consumption may be estimated or calculated from secondary measurements, such as temperature variations, thermodynamic cycle frequency, total current consumption by a plurality of assets, etc. For example, energy consumption may be determined by correlating temperature or measurements related to a thermodynamic cycle with current flow in an electrical main.

In some instances, a Mote 218, 226 may survey a plurality of sensors 216, 224 or otherwise receive measurements from the sensors 216, 224 on a periodic basis. The Motes 218, 226 may be configured to process the measurements to generate raw statistical data and perform certain filtering or statistical analyses, such as identifying trends, transitions from normal to abnormal operation based on crossings of threshold values, etc. The Motes 218, 226 may be configured to store and maintain a history of measurements, trend information and other metadata. The Motes 218, 226 may be configured to use a wired or wireless network interface 220, 228 to transmit stored information, raw measurements, alarms and status information and may signal occurrences of exceptions to normal operation to a centralized or distributed monitoring system and/or a centralized or distributed controlling system. The network interfaces 220, 228 may support communications with a network environment 230 that may comprise local networks, ad hoc networks, proprietary wide area networks and/or public networks including the Internet.

Figure 3:
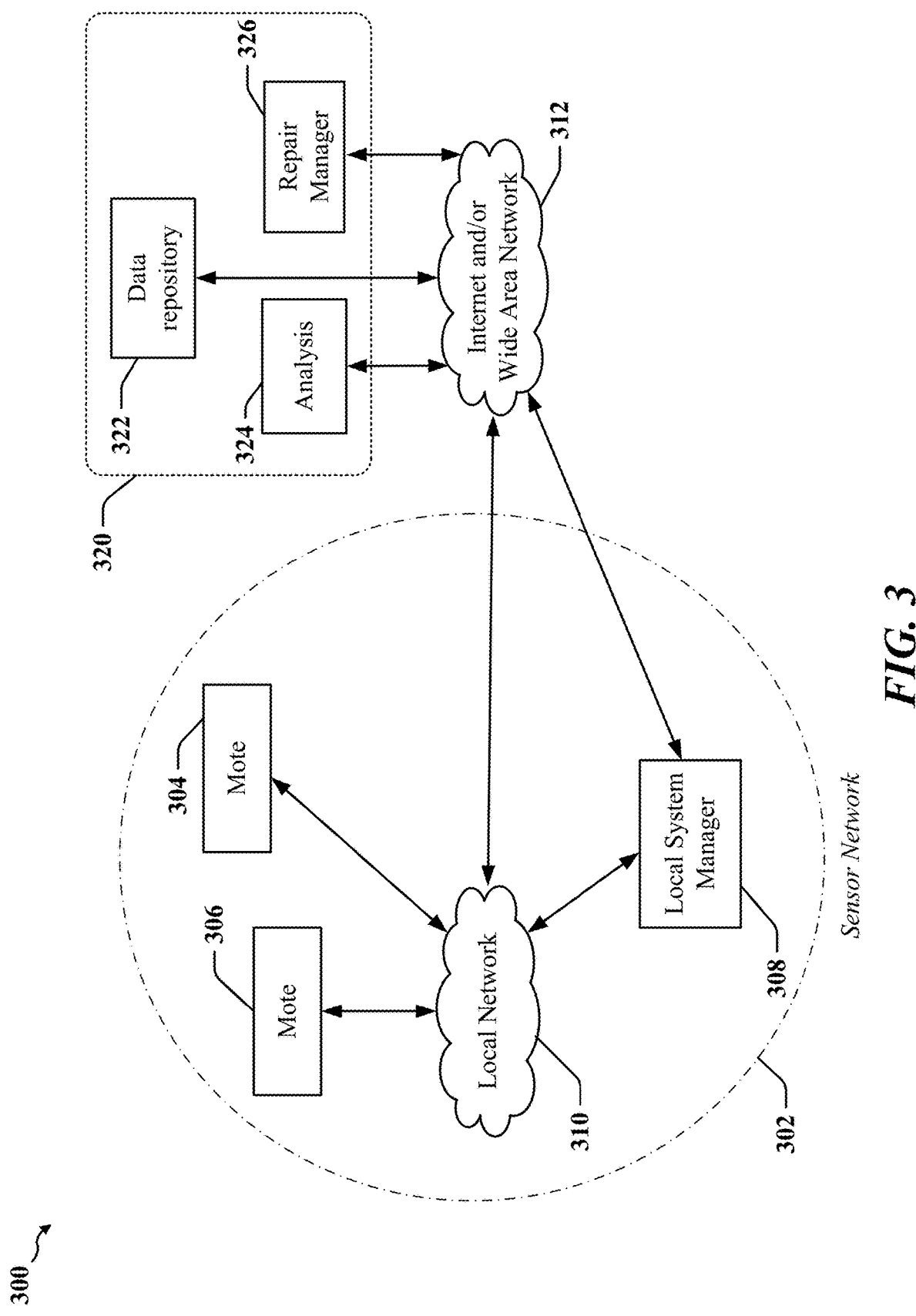
FIG. 3 illustrates a system for managing a network of refrigeration assets according to certain aspects disclosed herein.

FIG. 3 is a high-level block schematic diagram 300 illustrating an example of a system configured to provide centralized or distributed control and/or monitoring of assets. Motes 304, 306 may be deployed to communicate with, and/or control sensors that monitor certain aspects of a plurality of corresponding refrigeration systems. On a large campus, a sensor network 302 may be configured to more efficiently collect and distribute sensor data sampled by Motes 304, 306 from sensors, and/or from other sources associated with refrigeration assets on the campus. The sensor network 302 may conform to a hierarchical architecture. In one example, a sensor network 302 may have one or more local system managers 308 that are deployed to collect and/or aggregate sensor data and other information provided by the Motes 304, 306. A local system manager 308 may manage and/or comprise a network of controllers and/or device managers. The Motes 304, 306 and the local system manager 308 may communicate through a local network 310, which may comprise a wired or wireless network.

The sensor network 302 may be coupled to a processing system 320 through a network 312 that may comprise a proprietary wide area network and/or a public wide area network such as the Internet. The processing system 320 may be centralized or distributed over a plurality of networked computing systems. The processing system 320 may provide a plurality of functional elements and devices, including a data repository 322, which may include a database system, an analysis system 324 that may be configured to process and analyze measurements, statistical data and trends, metadata and other information received from the sensor network 302. The analysis system 324 may employ historical data, profiles, design goals and other information maintained by the data repository 322 to review, process and otherwise analyze information received from the sensor network 302. The processing system 320 may include a repair management system that manages a repair process and service providers involved in the repair process using information received or retrieved from the sensor network 302, the analysis function 324 and/or the data repository 322.

In certain embodiments, Motes 304, 306 and local system managers 308 of the sensor network 302 may communicate using connectionless communications systems. For example, one or more sensors may use a messaging service such as a Short Message System (SMS) cellular or a Multimedia Messaging Service (MMS). Other communications methods may be employed, including routable networks. In one example, communication within the sensor network 302 and between the sensor network 302 and public or private wide area networks may be based on protocols that establish a session used to exchange commands and data. In one example, communications may be facilitated through the use of protocols that establish a contiguous packet-based data connection utilizing a single routable protocol or other session comprised of non-contiguous data connections used to exchange commands and data.

Figure 4:
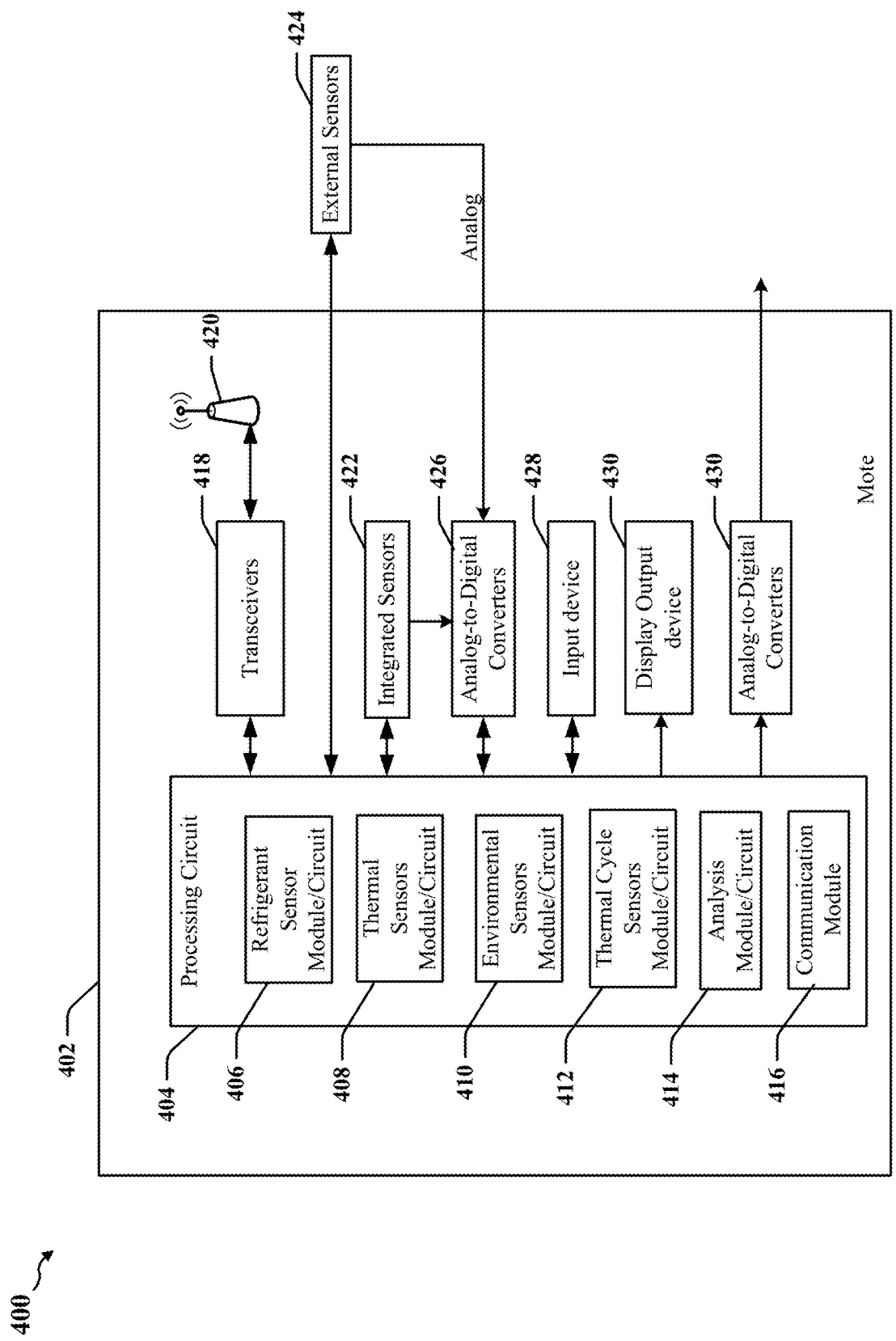
FIG. 4 illustrates a Mote according to certain aspects disclosed herein.

FIG. 4 is a block diagram 400 illustrating an example of an architecture for a Mote 402. With continued reference to FIGS. 1-3, the Mote 402 may be configured to connect to a network 230 by any available means. In one example, the Mote 402 includes a processing circuit 404 that may comprise one or more of a microprocessor, a microcontroller, a digital signal processor (DSP), sequencing logic, a state machine, etc. The Mote 402 and/or processing circuit may also include a variety of commonly used devices and components such as non-transitory storage, light emitting diode (LED) lamps or indicators, buttons or switches and/or an audible alarm indicator. The Mote 402 may include a communications transceiver 418 that includes radio frequency, optical or infrared transmitters and/or receivers. The Mote 402 may communicate with one or more sensors 422, 424, including sensors 422 that are incorporated in or integrated with the Mote 402 and/or external sensors 424 that may be coupled to the Mote 402 using wired physical connectors and/or wireless communications. The Mote 402 may additionally include a global positioning system receiver (not shown), a display controller 430, and user input controllers or drivers 428 that may interface with devices such as a keypad, touchscreen or the like.

The processing circuit 404 may include one or more analog-to-digital (A/D) converters 426 configured to receive analog inputs from one or more of the sensors 422 and/or 424 for example, and one or more digital-to-analog (D/A) converters 430. The processing circuit 404 may include one or more sensors 422 and/or sensor control circuits. For example, certain sensors may be provided in an integrated circuit device, on a chip carrier or circuit board that carries the processing circuit 404. The may be configurable to connect to one or more external sensor devices 424 The sensors 422, 424 may include transducers that can be used to sense or measure door position, pressure, acceleration, temperature, humidity, magnetic field, light, load, inclination, radio frequency identification (RFID) signals and or RFID return signals, whether related to a passive or active RFID tag. The processing circuit 404 may include a battery or energy scavenging device and a wired, wireless, infrared, or magnetically coupled interface 418 that is coupled to an antenna 420 used for communications.

Figure 5:
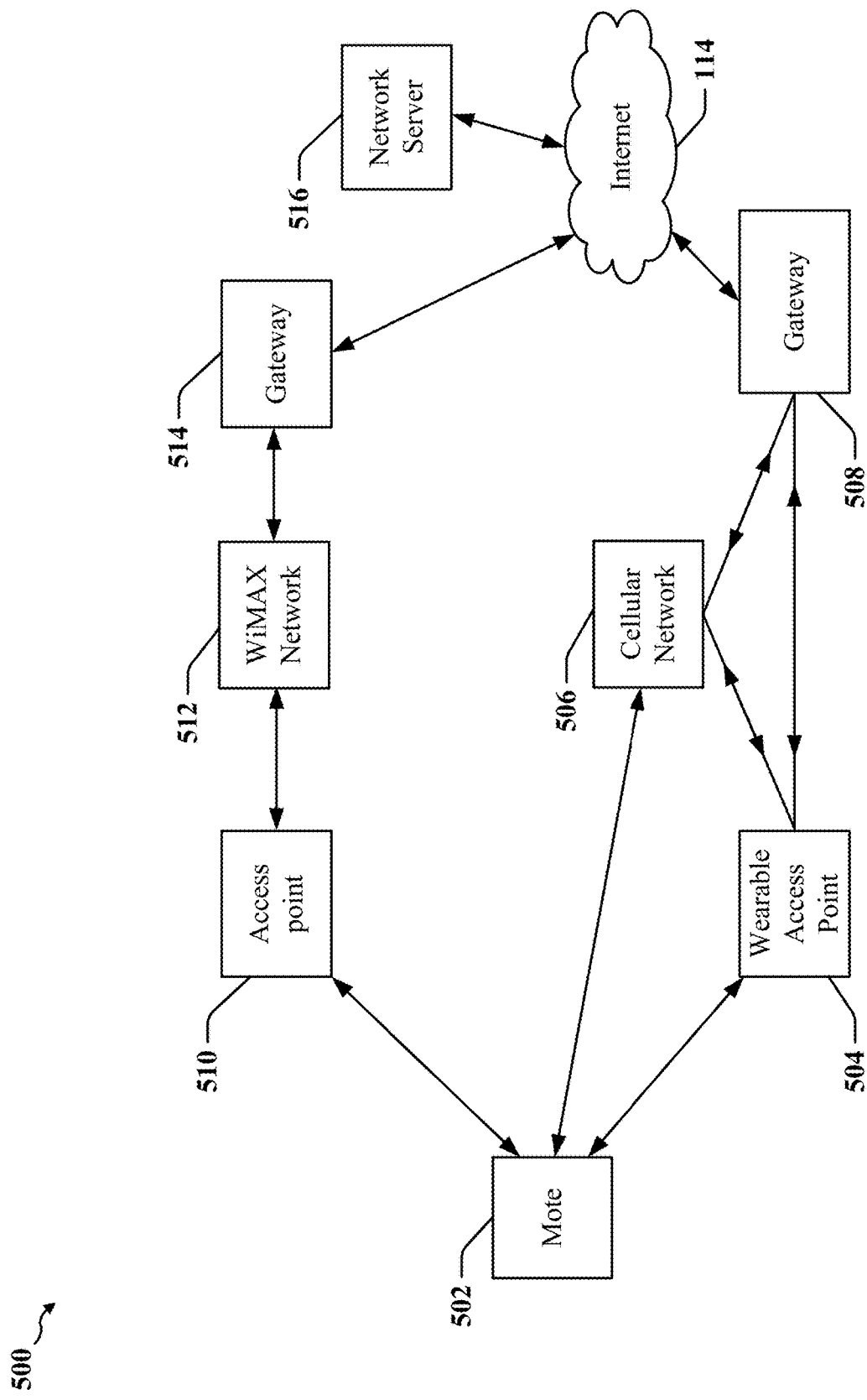
FIG. 5 illustrates a routable network accessed by a smart sensor according to certain aspects disclosed herein.

With reference to FIG. 5, a Mote 502 may exchange data with networked entities 516 using one or more networks that may be accessible through gateways 508, 514. The process of information gathering or data harvesting from one or more smart sensors 502 may be referred to herein as "data backhaul." Data may be harvested by means of a wired or continuous wireless network (WLAN) connection such as GPRS or other cellular network 506, and/or a WiMAX network 512. The Mote 502 may include one or more radio frequency (RF) transceivers operable to connect through a wireless access point 510 and/or through a purpose-built data collection agent such as a wearable access point 504 in a conventional or ad hoc network.

Certain embodiments of the invention employ systems and methods that may select assets for repair and that may evaluate the subsequent repair process and the results of repairs. In one example, repairs may be evaluated with respect to changes in status, reliability or energy consumption. An analysis of performance data and metadata may be used to select assets in need of maintenance and/or repair. In some instances, the analysis of performance data may be used to suggest or select a repair process to address identified performance issues and other conditions. Information collected during the repair process may be captured and/or aggregated to assist in later analyses. Such information may be used to devise new repair strategies, policies and/or standard operating procedures.

In certain embodiments, a user may provide contextual information such as performance characteristics, design, type, make, model, manufacturer, configuration, repair history, configuration settings, environmental conditions, and other in-service information (which may be collectively referred to as metadata) to facilitate a better understanding of the many factors and variables that could affect performance of refrigeration systems and the effectiveness and long-term persistence of repairs and repair methodologies.

Certain embodiments may employ asset tagging features and methods to correlate information obtained from sensors and metadata with performance analysis and benchmarking information and/or information identifying whether repairs result in improved or achievement of expected levels of performance. Tags may be added, deleted or changed to characterize the state-of-health and status of repairs. In one example, a user and/or the system may increment or decrement the status or state of a repair to indicate a desired or deemed status of the asset so as to control the next response or action of a service provider. In this manner, the system can keep the service provider engaged and accountable until the repair is determined to have been effective and/or persistent over time, such that the refrigeration assets performs in accordance with desired or targeted performance levels and/or for a predetermined period of time after the repair.

To facilitate efficient repair and maintenance practices, the repair process may be managed and controlled in stages. Stages and gates may be defined to control progress between stages. For example, certain gates may control whether one or more further actions are allowed or not allowed depending on successful completion of previous states, events or outcomes.

In certain embodiments, systems and methods are provided that report changes or improvements, or lack thereof, in measured or observed performance before, during or after service, maintenance or repairs. Computing devices may be configured to determine if applied maintenance results in improved or expected levels of performance. Computing devices may be configured to determine whether improvements following repair are persistent, such that improved or desired performance continues at various points and times after time of service.

In certain embodiments, systems can be packaged for remote deployment by a field service technician for example. Sensor generated information and metadata may be processed at deployed systems in real-time and the results may be stored locally and downloaded for evaluation at a later time, or transmitted periodically through a network for evaluation at a central location. In this manner, results gathered and processed at remotely deployed devices may be aggregated, analyzed and/or reviewed centrally using more powerful analytical tools and drawing on centralized human and machine expertise as required. In some instances, information aggregated from disparate sources and/or multiple operators (federated data) may be used by the analytical tools.

In certain embodiments, information and metadata may be acquired indirectly and included in processing and decision-making. For example, technicians, operators and other persons performing various operations, including examination, maintenance and/or repair operations related to a refrigeration system may obtain information relevant to the operations and/or status of the refrigeration system, and such persons may enter such information for evaluation. In this manner, results and other information gathered and processed at remotely deployed devices may be aggregated, analyzed and/or reviewed centrally regardless of whether such information is obtained automatically from sensors and other equipment, or by human intervention or observation. Data that is entered manually may include equipment location and historical repair information or qualitative or quantitative data related to configuration, environmental or operating conditions such as room temperature voltage levels measured at one or more points in an electrical circuit, repair information such as observed condition of filter media, air-flow restrictions, repair type codes and cost of repairs for one or more codes. According to certain aspects described herein, raw data can be imported from another system and included in analysis.

Certain aspects of the present invention relate to systems, apparatus and methods for identifying and/or selecting refrigeration assets in need of repair and/or managing a repair process for the selected or identified refrigeration assets. Refrigeration assets, performance levels of the refrigeration assets, defects, imperfections and repairs initiated for the refrigeration assets may be classified in accordance with certain aspects disclosed herein. In one example, refrigeration assets may be classified according to configuration, in situ environment, reliability, performance, make, model, and manufacturer. The repair process may be optimized and the effectiveness and persistence of repairs over time may be determined in accordance with certain aspects disclosed herein. In one example, the effectiveness of repairs may be classified in relation to a service provider, which may include a commercial enterprise, internal service organization and/or an individual selected to perform repairs.

Figure 6:
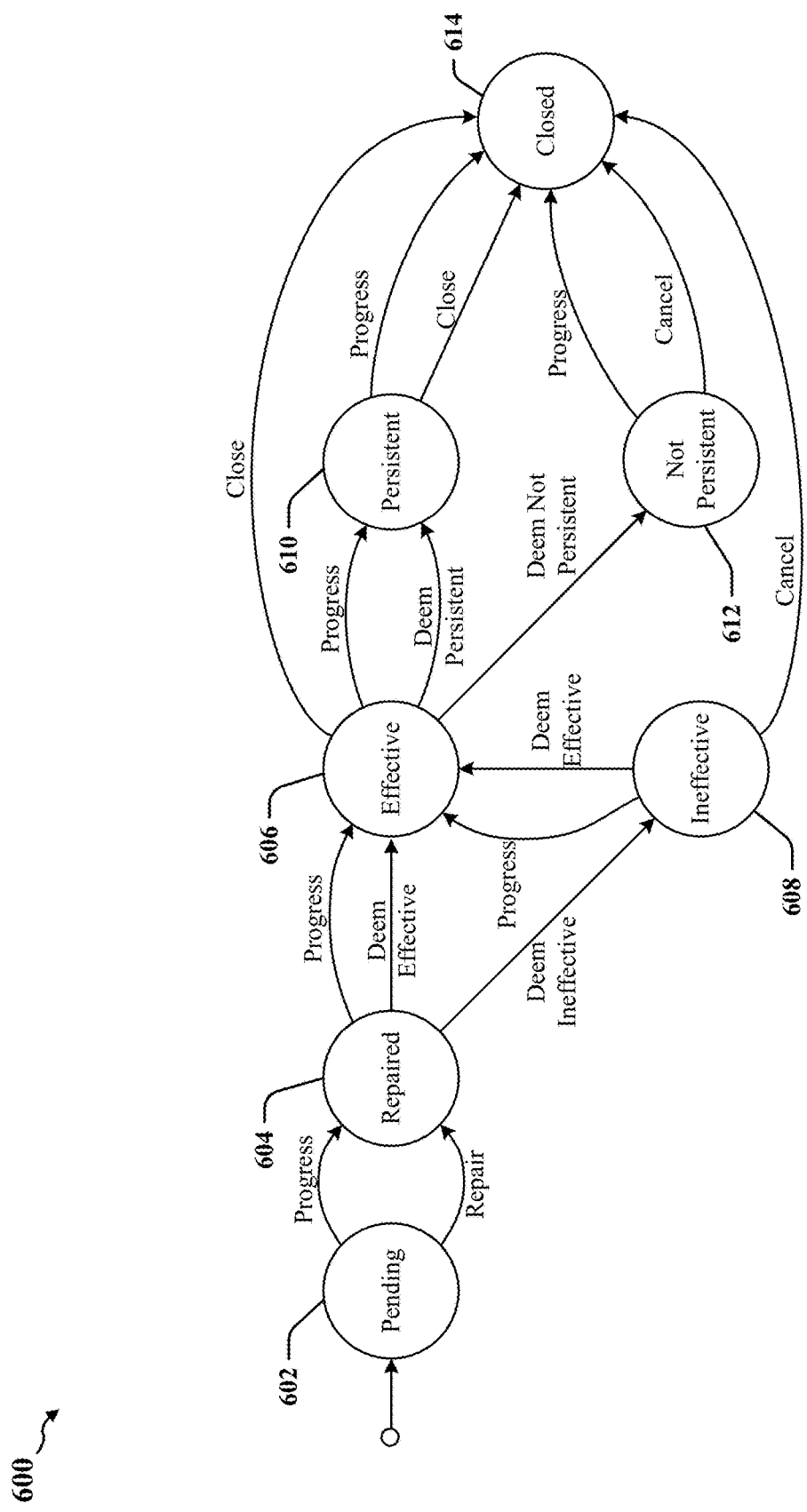
FIG. 6 is a state diagram illustrating a workflow managed by certain aspects disclosed herein.

FIG. 6 is a partial state diagram 600 illustrating certain aspects disclosed herein. A field service technician may be provided with instructions identifying or suggesting services and repairs that may be performed. Notifications may be generated or received indicating whether the repairs prove to be effective and persistent over time. In one example, notifications may be received from the sensor network 302 and/or from service providers responsible for repairs. In an initial state 602, repairs are considered to be in a pending state. While in the pending state, a service technician may be dispatched. The service technician may be provided with information identifying a refrigeration system 202 to be repaired, one or more symptoms and a repair protocol explicitly identifying or suggesting repairs to be made during a service call. The service technician may execute the repair protocol or, in some instances, may replace a failing refrigeration system 202, and the process moves to a repaired state 604. In the repaired state 604, the target refrigeration system 202 may be tested and/or monitored to determine if the repair was effective. In one example, testing and monitoring may include an analysis of sensor data provided by one or more Motes 218, 226.

If the repair is deemed ineffective, then at state 608, further repair and/or monitoring may be conducted to determine if the effective state 606 can be achieved by means of additional repairs or reconfiguration. If the ineffective state 608 cannot be corrected, then the repair process may be cancelled and the repair activity enters a closed state 614. If the repair has been deemed or determined to be effective, then in the Effective state 606, the operation and performance of the refrigeration system may be monitored for one or more periods of time to determine if the repairs are persistent over time. In one example, monitoring may include an analysis of sensor data provided by one or more Motes 218, 226. The one or more periods of time may be contiguous periods of time, or may be spaced over a more prolonged monitoring period. In some instances, no further monitoring is needed and the repair process may enter a closed state 614 from the effective state 606. The period of time during which repair monitoring is performed at the Effective state 606 may be identified in a repair protocol and, when the effects of the repair persist, the process may move to a Persistent state 610 from which the process may be manually or automatically transitioned to a closed state 614. If, however, the repairs are determined to be non-persistent, the process may move to a "Not Persistent" state 612 from which the process may be manually or automatically transitioned to a closed state 614.

In certain embodiments, system-generated reports can provide documentation that enable utility companies and municipalities and/or state entities to provide energy rebates and incentives. The reports may determine an amount of incentive or rebate due by calculating deemed energy savings or net energy savings by adding or subtracting all energy gains and losses over a defined time period for each asset, then all monitored assets in total, thence applying a rate or factor representing the amount of incentive or rebate due for each unit of energy saved or lost over a prescribed period.

In certain embodiments, a service provider may issue an invoice for a repair, which may include a code issued by the system to confirm that a repair activity meets predefined thresholds and standards for post-repair performance and effectiveness. The code may be interpreted by a customer of the service provider responsible for repairs as confirmation that the performance and/or deemed effectiveness or deemed persistence standards have been met by the repair or that maintenance has achieved desired levels of performance optimization.

Data Flow in a Repair Process

Certain embodiments of the invention for measuring the state-of-health of a refrigeration asset employ or are based on certain systems and methods for monitoring, inferring state of health, and optimizing efficiency of refrigeration systems as described in the commonly owned U.S. Pat. No. 8,725,455 and its progeny (including U.S. patent application Ser. No. 14/275,771), which are included in their entirety by reference herein.

According to one or more aspects disclosed herein, refrigeration systems may be monitored using wired or wireless sensors (see the Mote 402 of FIG. 4, for example), which transmit data to a processing system 320 (see FIG. 3) for analysis and benchmarking related to performance. Performance data for a target refrigeration system may be processed, analyzed, indexed and/or plotted in reference to time, benchmarks and/or predetermined or predefined norms, in order to determine relative performance of the target refrigeration system in relation to one or more peer systems. The peer systems may be defined based on the classification of the target refrigeration system based on characteristics and attributes such as reliability, configuration, in situ environment, performance, make, model, manufacturer, application and/or an operational history of the target refrigeration system. The analysis of performance data may employ one or more mathematical or pattern recognition functions, such as a sine wave or a statistical model.

According to certain aspects, contextual information may be obtained from a user or by querying a database or other repository of information. In one example, the user may provide access to contextual information such as such as design, make, model, configuration, repair history, configuration settings, environmental conditions, and other in-service information ("Meta Data") that may facilitate an understanding of the various factors and variables that may affect, measure or qualify performance of a refrigeration system and/or the effectiveness and persistence of a repair process and corresponding repairs.

Figure 7:
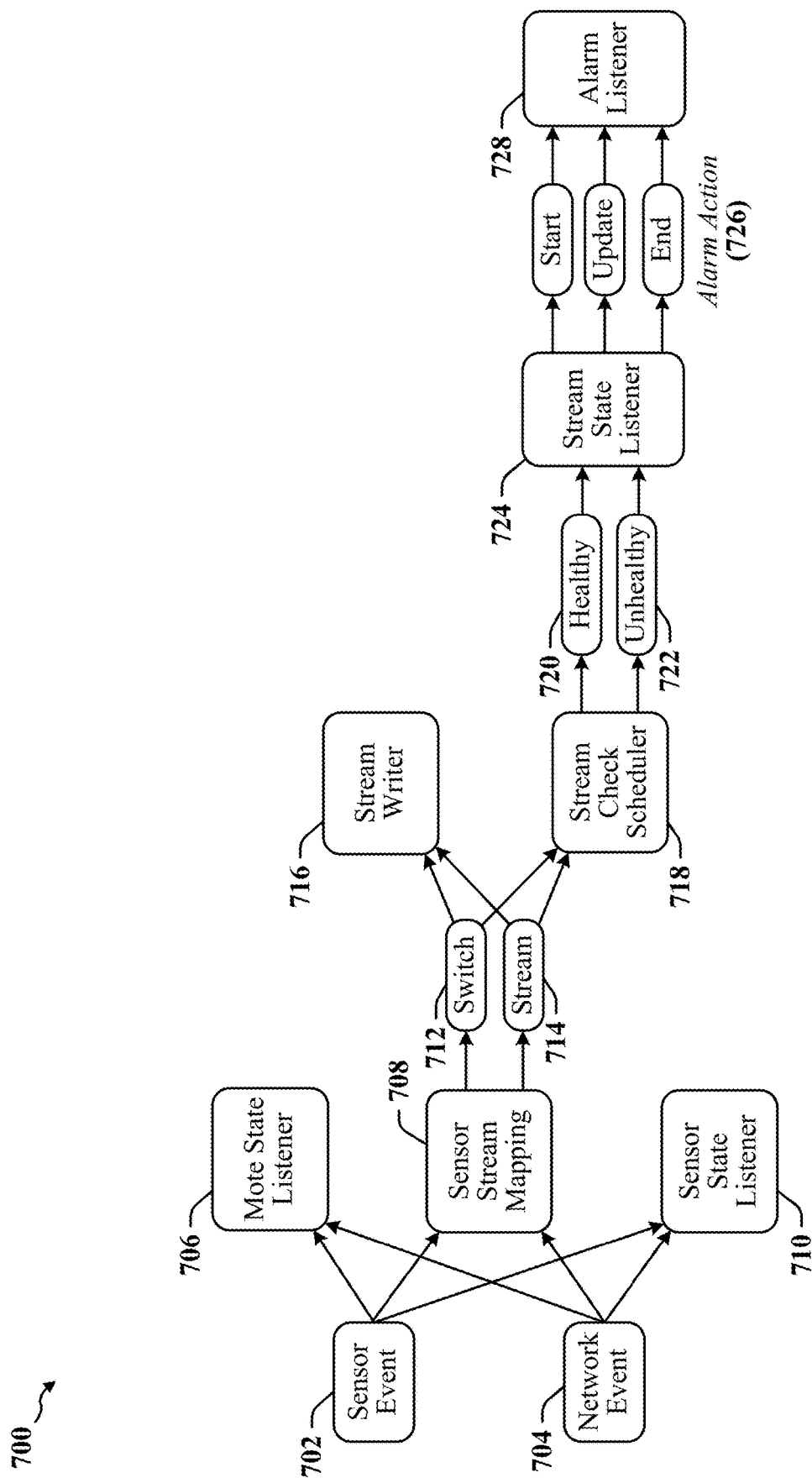
FIG. 7 is a data flow diagram that illustrates one example of sensor data acquisition, processing, and analysis in accordance with certain aspects disclosed herein.

FIG. 7 is a data flow diagram 700 that demonstrates one example of sensor data acquisition, processing, and analysis. Various systems and circuits may cooperate in the data flow. The data flow may be initiated by a sensor event 702 that indicates that sensor data is available or a network event 704 that relates to network quality. The sensor event 702 may be generated when one or more Motes 102, 104 or aggregator 106 (see FIG. 1) has sensor data for processing. The one or more Motes 102, 104 or aggregator 106 may generate the event in a store-and-forward mode of operation, and/or after performing some initial analysis of the sensor data. The network event 704 may relate to network quality metrics, and may indicate a packet error rate, signal strength, signal-to-noise ratio (SNR), signal-to-interference-plus-noise ratio (SINR), or other metric that may indicate that the network connection is unreliable or trending towards unreliability. The network event 704 may require attention to avoid masking issues related to a monitored asset that cannot be timely communicated due to degradation of network connection quality.

A Mote state listener 706 may be configured to receive and process events 702, 704 and to update the state of an affected Mote 102, 104. A sensor state listener 710 may be provided to receive and process events 702, 704 for sensor related issues, and to update the state of affected sensors. A sensor stream mapping module and/or circuit 708 may receive and process the events 702, 704, and may transform sensor data to obtain a stream meta-object for further processing and analysis. The sensor stream mapper 708 may produce outputs in different formats 712, 714 that may be used to initiate and/or update a repair process. A journaling system (Stream Writer) 716 may be configured to store data in one or more formats 712, 714 for later replay.

The outputs 712, 714 of the sensor stream mapper 708 may be provided to a scheduler 718 that updates a scheduling system used for managing diagnostics on sensor data. The scheduler 718 may process sensor data to determine whether a change in status of an asset indicates that a repair should be initiated, continued, and/or terminated. In one example, the scheduler 718 may generate events or other indications 720, 722 related to an asset that may be categorized as healthy state events 720 or unhealthy state events 722. A listener module 724 may monitor such events 720, 722 in order to generate one or more alarm actions 726, including Start Alarm, End Alarm, and/or Update Alarm state. An alarm listener 728 may be used to capture and report alarm state to a user of the system.

Figure 8:
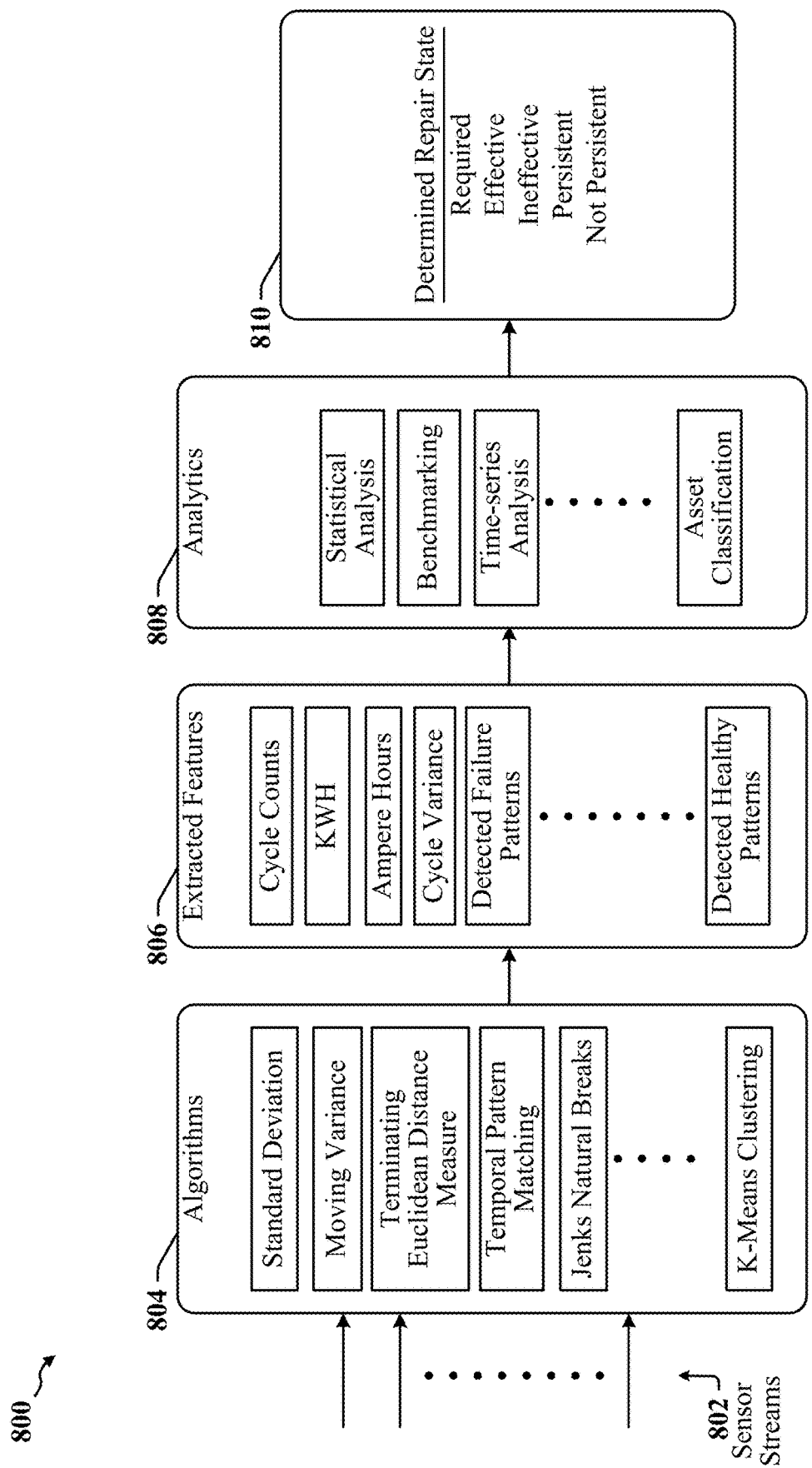
FIG. 8 is a data flow diagram that illustrates certain aspects of sensor data processing and analysis using sensor streams in accordance with certain aspects disclosed herein.

FIG. 8 is a data flow diagram 800 that illustrates certain aspects of sensor data processing and analysis using sensor streams 802. A sensor stream 802 may comprise a time series of sensor data streamed from a sensor or replayed from storage. The sensor streams 802 may be derived from sensor data provided by one or more Motes 102, 104 and may be processed using one or more algorithms 804. The sensor data algorithms may include simple measures such as maximum and minimum alarm points, or more robust methods such as a standard deviation algorithm used to observe uniformity within windows of a sensor stream 802. The algorithms may include a moving variance algorithm used to detect state changes in various elements of a system, including state changes in a compressor, for example. The algorithms may include a temporal pattern matcher algorithm configured to compare windows of sensor data for similarity scoring using one or more distance functions. The algorithms may include a terminating Euclidean distance measure algorithm or other simple distance function for pattern matching. The algorithms may include a Jenks natural breaks algorithm, a K-Means clustering algorithm or another clustering algorithm that provides a mechanism for clustering sensor data to separate states and/or to find aggregate values.

Certain features 806 may be extracted from processing the sensor data. The features 806 may include cycle counts indicating the number of cycles a compressor has, based on amperage/energy sensor or other data. The features 806 may include energy usage expressed as kilowatt-hours (kWh) or the like, and determined as the area under a power curve for a window of sensor data. Other values may be derived from energy usage including ampere-hours, for example. Ampere hours may be calculated using the formula Ampere Hours=kWh/(1000*volts). The features 806 may include cycle variance, which may correspond to the variance in duration of cycles such as thermodynamic cycles. Cycle variance may be used to indicate instability in a component or element of an asset when other factors remain stable. The features 806 may include detected failure patterns, which may correspond to a Pattern ID that can be matched in a pattern matching process to identify a known issue associated with a pattern exhibited in the sensor data. The features 806 may include detected healthy patterns, which may correspond to a Pattern ID that can be matched in a pattern matching process to identify expected behavior associated with a pattern exhibited in the sensor data.

Certain analytics methods 808 may be applied to discover meaningful patterns and behaviors from the sensor data. A statistical analysis may be used to examine features as a sample from one or more like sensors to find population norms. Benchmarking may be employed to compare the features and/or characteristics of multiple sensors to determine the distribution of values within a population, and to use the corresponding percentile to score the feature of that asset. A time-series analysis may be applied to identify features for a single sensor over time, and/or to determine trends or changes, which may indicate the onset of failure. Asset classification may be used to classify or tag assets based on computed values, changes over time, etc. Asset classification may consider all data to determine if an asset should be tagged for repair, for example. Asset tags can be added or removed based on trends.

Other data may be considered in addition to the sensor data. In one example, a fusion of sensor data and disparate data elements may be employed to learn new things. For example, one or more sensors may be employed to monitor plug load energy consumption in a defined area such as in a room. Plug load energy is consequently an object that can be benchmarked in a manner similar to other objects such as compressors used in a refrigeration system. Such sensor data may be fused with other data to detect human activity and energy intensity in the area. In one example, the placement of additional equipment in the room may indicate a new use pattern for the area, or more or less water or lighting being used than before or in comparison to other objects. These new data from external sources may be mined to derive a better understanding of energy utilization relative to other monitored objects deemed to be similar or comparable.

One or more states 810 may be defined for a monitored asset. The states 810 may be communicated using a grading system that can be expressed graphically and/or textually. For example, a color-coding scheme may be applied to a graphical display indicating current performance metrics, such as power consumption, cycle variance, temperature curves, and the like. An asset may be graded using a configurable and/or familiar color-coding system (Green, Yellow and Red), such that the performance of each asset can be determined in comparison to known achievable levels of performance and energy efficiency to its peers (same make/model) in the population. Grading scores may be derived from sensor data obtained from sensors associated with assets deployed in a variety of settings, locations, and configurations.

In one example, assets performing within expectations may be color-coded as Green assets, while underperforming may be coded as Yellow or Red assets. A higher grade (Green) may indicate that the asset is deemed to be operating efficiently, and/or may be consuming less energy than the average of its peers. A next grade (Yellow) may indicate that the scored asset is exhibiting signs of stress and is consuming more energy than the average of its peers. Although there is some potential for energy savings, payback for repairs on these assets may not be as attractive, although repairs and mitigation measures on these assets may achieve higher levels of reliability as an operational policy decision. A low grade (Red) indicates serious maintenance, configuration, environmental, and/or other problems. Assets scored "Red" may be immediate candidates for repair as they are exhibiting signs of stress consistent with imminent mechanical failure, in addition to wasting significant amounts of energy.

Scoring may be accomplished when enough data for a specific asset make/model group is available. A color-code score may be assigned to each asset based on its current performance, before repairs, and/or relative to its peers in a database of the same or similar make/model assets. Asset grades may be assigned based on statistical analysis that may identify an Optimal Level of Performance (OLP) based on a predefined standard deviation. In one example, the top 10% statistically and best performing assets for the make/model may be deemed to have achieved the OLP, and no repairs need be performed on these assets and in many cases maintenance can be deferred for this assets. An asset that is assigned a grade of Yellow may exhibit a calculated annual energy consumption that is 76% to 89% of the OLP. These assets are candidates for repair. An asset may be assigned a grade of Red if the projected annualized kWh is less than 75% of the OLP. Such assets may be identified as candidates for immediate repair.

In one example, a proxy profile may be used to temporarily assign a make/model profile to an asset. An administrator may select a proxy, which represents a similar asset in terms of size, age and construction. Once it has been determined that the database contains a sufficiently large sample for the target make/model, then the proxy or the make/model group may be removed and the system may score the assets using the automated scoring methodology described above using empirical data.

In another example, estimated asset scoring may be employed when there is insufficient make/model data in the database to score an asset. An estimated grade may be assigned based on an analysis of compressor cycling or other known measure of mechanical stress that is highly correlated with energy consumption. An asset may be assigned a grade of Green if the compressor on-time is below 74%. No repairs need be performed on these assets. An asset may be assigned a grade of Yellow if the compressor on-time is 75%-84%. These assets are candidates for repair. An asset may be assigned a grade of Red if the compressor on-time is above 85%. These assets may be candidates for immediate repair.

A benchmark scoring process may be run automatically once per month and prior history is retained by the system such that asset grade changes, attributable to changes in asset performance, can be tracked over time for each individual asset.

Examples of Systems and Methods for Managing Effectiveness of Repairs

Figure 9:
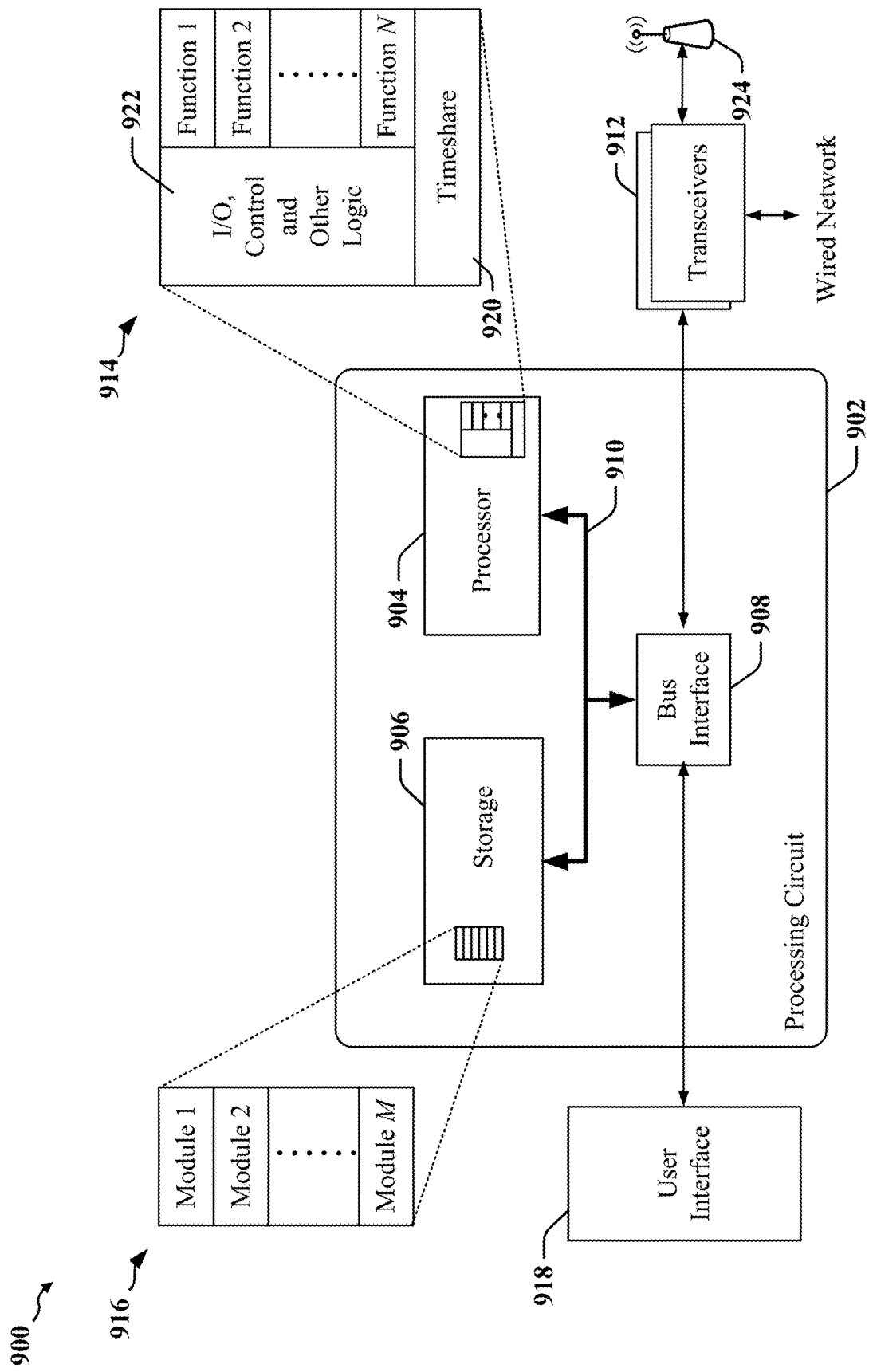
FIG. 9 is a block diagram illustrating an example of an apparatus employing a processing system that may be adapted according to certain aspects disclosed herein.

FIG. 9 is a conceptual diagram 900 illustrating a simplified example of a hardware implementation for an apparatus employing a processing circuit 902 that may be configured to perform one or more functions disclosed herein. In accordance with various aspects of the disclosure, an element, or any portion of an element, or any combination of elements as disclosed herein. The processing circuit 902 may include one or more processors 904 that are controlled by some combination of hardware and software modules. Examples of processors 904 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 904 may include specialized processors that perform specific functions, and that may be configured, augmented or controlled by one of the software modules 916. For example, the processing circuit may be configured as communications processors and other processors that are adapted to handle encoding and decoding of data for transmission on one or more wired or wireless networks. The one or more processors 904 may be configured through a combination of software modules 916 loaded during initialization, and may be further configured by loading or unloading one or more software modules 916 during operation.

In the illustrated example, the processing circuit 902 may be implemented with a bus architecture, represented generally by the bus 910. The bus 910 may include any number of interconnecting buses and bridges depending on the specific application of the processing circuit 902 and the overall design constraints. The bus 910 links together various circuits including the one or more processors 904, and storage 906. Storage 906 may include memory devices and mass storage devices, and may be referred to herein as computer-readable media. The bus 910 may also link various other circuits such as timing sources, timers, peripherals, voltage regulators, and power management circuits. A bus interface 908 may provide an interface between the bus 910 and one or more transceivers or line interface circuits 912. A transceiver 912 may include encoders, decoders, and radio frequency transmitters and receivers that are used in communicating with various other apparatus over a wired or wireless network or through an opportunistic wireless connection. Depending upon the nature of the apparatus, a user interface 918 (e.g., keypad, display, speaker, microphone, joystick) may also be provided, and may be communicatively coupled to the bus 910 directly or through a bus interface 908.

A processor 904 may be responsible for managing the bus 910 and for general processing that may include the execution of software stored in a computer-readable medium that may include the storage 906. In this respect, the processing circuit 902, including the processor 904, may be used to implement any of the methods, functions and techniques disclosed herein. The storage 906 may be used for storing data that is manipulated by the processor 904 when executing software, and the software may be configured to implement any one of the methods disclosed herein.

One or more processors 904 in the processing circuit 902 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 906 or in an external computer readable medium. The computer-readable medium and/or storage 906 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium and/or storage 906 may also include, by way of example, a carrier wave, a transmission line, and any other suitable medium for transmitting software and/or instructions that may be accessed and read by a computer. The computer-readable medium and/or the storage 906 may reside in the processing circuit 902, in the processor 904, external to the processing circuit 902, or be distributed across multiple entities including the processing circuit 902. The computer-readable medium and/or storage 906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 906 may maintain software maintained and/or organized in loadable code segments, modules, applications, programs, etc., which may be referred to herein as software modules 916. Each of the software modules 916 may include instructions and data that, when installed or loaded on the processing circuit 902 and executed by the one or more processors 904, contribute to a run-time image 914 that controls the operation of the one or more processors 904. When executed, certain instructions may cause the processing circuit 902 to perform functions in accordance with certain methods, algorithms and processes described herein.

Some of the software modules 916 may be loaded during initialization of the processing circuit 902, and these software modules 916 may configure the processing circuit 902 to enable performance of the various functions disclosed herein. For example, some software modules 916 may configure internal devices and/or logic circuits 922 of the processor 904, and may manage access to external devices such as the transceivers or wired interfaces 912, the bus interface 908, the user interface 918, timers, mathematical coprocessors, and so on. The software modules 916 may include a control program and/or an operating system that interacts with interrupt handlers and device drivers, and that controls access to various resources provided by the processing circuit 902. The resources may include memory, processing time, access to the transceivers 912, the user interface 918, and so on.

One or more processors 904 of the processing circuit 902 may be multifunctional, whereby some of the software modules 916 are loaded and configured to perform different functions or different instances of the same function. The one or more processors 904 may additionally be adapted to manage background tasks initiated in response to inputs from the user interface 918, the transceivers 912, and device drivers, for example. To support the performance of multiple functions, the one or more processors 904 may be configured to provide a multitasking environment, whereby each of a plurality of functions is implemented as a set of tasks serviced by the one or more processors 904 as needed or desired. In one example, the multitasking environment may be implemented using a timesharing program 920 that passes control of a processor 904 between different tasks, whereby each task returns control of the one or more processors 904 to the timesharing program 920 upon completion of any outstanding operations and/or in response to an input such as an interrupt. When a task has control of the one or more processors 904, the processing circuit is effectively specialized for the purposes addressed by the function associated with the controlling task. The timesharing program 920 may include an operating system, a main loop that transfers control on a round-robin basis, a function that allocates control of the one or more processors 904 in accordance with a prioritization of the functions, and/or an interrupt driven main loop that responds to external events by providing control of the one or more processors 904 to a handling function.

Figure 10:
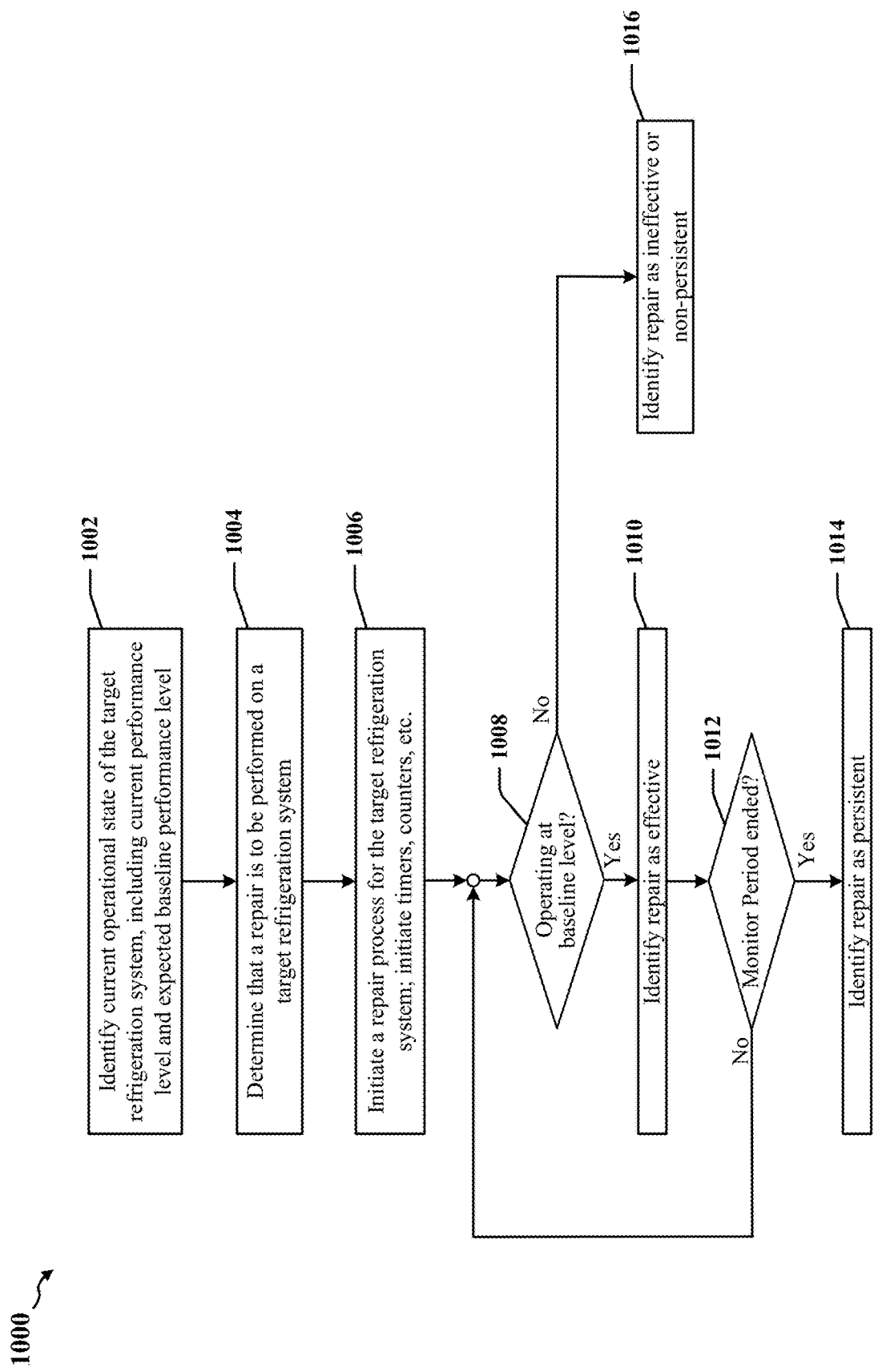
FIG. 10 is a flowchart illustrating a second example of a method of managing the effectiveness of repairs in refrigeration assets.

FIG. 10 is a flowchart 1000 illustrating an example of a repair process that may be managed according to certain aspects disclosed herein. The repair management process begins at block 1002 when a current (or "pre-repair") baseline may be obtained from measurements taken for a targeted refrigeration system, prior to the start of the repair. The current baseline and/or one or more other baselines may be created for any attributes that can be measured or calculated for the refrigeration system, including in reference to its peers. In some instances, the baseline may relate to averages of measurements and calculations obtained from a group of peer refrigeration systems or refrigeration assets. In some instances, the baseline may relate to measurements and calculations obtained from a specific set of refrigeration assets classified according to performance within a particular environment or context. For example, the performance of a specific set of refrigeration assets may correspond to hot room, cold room, low airflow, and/or low voltage configurations.

At block 1004, the system determines that a repair is to be performed for a refrigeration system. The determination may be based on the evaluation of one or more baselines for one or more attributes of the refrigeration system. The baselines may be used as known achievable goals to guide and/or control the repair process. A normal baseline may be identified, where the normal baseline identifies expected values for a given attribute or operating characteristic of the refrigeration system to be repaired, or for an idealized or optimally operating refrigeration system of a comparable or same type. In one example a baseline may be determined from manufacturer-provided information. In another example, the baseline may be a manufacturer-provided or user-specified baseline based on experience with comparable equipment, or an empirical baseline obtained from observed performance of the refrigeration system targeted for repair, or from observed performances of a peer group of refrigeration systems.

In some instances, recommendations of a make and/or model of refrigeration asset may be made for use in a specific context where the recommended refrigeration asset may not score well in other contexts and/or may exhibit lower performance levels when measured on average against its peers. In one example, a refrigeration asset may be recommended when high door access activity is anticipated when the recommended refrigeration asset exhibits superior recovery efficiency. In another example, a refrigeration asset may be recommended for usage in a low-voltage environment. In another example, a refrigeration asset may be recommended for usage in a room that has poor airflow. In these examples, recommendations may be made using alternative scores that are generated based on different conditions of installation or use.

At block 1006, the repair is initiated. A repair technician may begin by assessing the equipment health and assigning problem codes and one or more repair codes associated with the target refrigeration system. These problem codes and repair codes may be used to determine expected post-repair performance levels and/or performance level improvements for the target refrigeration system, which may be expressed in one or more post-repair baselines. Each of the post-repair baselines may relate or correspond to one or more measurable or calculable attributes. After the repair is physically completed, the repaired refrigeration system may be allowed to stabilize prior to capturing one or more post-repair baselines from measured attributes and performance parameters of the repaired refrigeration system.

At block 1008, the one or more post-repair baselines may be used to determine if the repair was effective. The determination may be based on one or more of the measured attributes. In some instances, measurements of all of the attributes in the one or more post-repair baselines may not be available immediately after repair, and the assessment of the effectiveness of the repair may be a partial assessment and/or provisional in nature. One or more algorithms may be applied to compare one or more post-repair baselines with corresponding pre-repair baselines and/or normal baselines to determine if the repair was effective. If the repair is deemed not effective at block 1008, then a notation to that effect may be made at block 1016 and a repair may be attempted again.

If at block 1008 the repair is determined to be at least provisionally effective, then at block 1010 a notation to that effect may be recorded in a log, journal or other information characterizing the repaired refrigeration system. A provisional determination of effectiveness may be confirmed or retracted after new measurements are obtained after the refrigeration system has fully stabilized. The expected post-repair baselines may identify the duration of the settling period of time. This decision of effectiveness may be based on repair codes and on the peer group that is being used for comparison.

In the event that an effective repair is determined, the repaired refrigeration system may be monitored for a period of time after the repair is deemed effective to determine whether the repair is persistent. In some instances, the latter determination may be used to determine if a utility incentive payment may be applicable. For example, the period of time may be selected based on a deemed measure defined by an energy provider who offers energy incentives and rebates to promote energy efficiency measures. A persistent repair may be a repair that returns the repaired refrigeration system to normal operation for a prolonged period of time. Normal operation may be defined by the system, an operator, an energy producer, or the like. The prolonged period of time may be determined when the repair is initiated at block 1006. Various criteria may be applied to define the point at which the repair may be determined to be persistent over time. In some embodiments, a counter, timer and/or other metering device may be employed to measure elapsed time from repair until the point at which the repair can be determined to be persistent. In one example, a timer may be initiated to define a time-based monitoring period during which total energy consumption must remain below a predetermined threshold. In another example, a cycle counter may be configured to define a range or total number of cycles or amount of compressor active/on-time to be achieved or maintained in order to determine persistence of repair.

The timer, counter and/or other meter may be monitored at block 1012 to determine when the repair can be deemed effective at block 1014. If the monitoring period has not expired, the performance of the repaired refrigeration system may be continually or continuously assessed during the monitoring period and post-repair baselines may be updated or augmented with measurements obtained during the monitoring period. Accordingly, additional determinations of effectiveness of the repair may be made (at block 1008) during the monitoring period. In one example, the additional determinations of effectiveness may continue until the repair is determined either ineffective at block 1016 or effective and persistent at block 1014, after expiration of the monitoring period. Problem and repair codes may be analyzed, correlated and associated with the specific make/model or design of the refrigeration system to programmatically ascribe, for future reference, recurring problems and repair codes for specific make/models or designs.

In some instances, measurements captured at a plurality of refrigeration assets by one or more smart sensors, Motes, or smart modules may be configured to communicate the measurements through a datalogger. The data logger may be implemented using circuits or modules of the smart sensors, Motes, or smart modules. The datalogger may store or otherwise maintain sensor data and other information that can be communicated through a network after the datalogger has identified or established a network connection. In certain examples, information collected from smart sensors, Motes, or smart modules may be transmitted to an analysis system through a network at a predefined rate (e.g. every 4 or 8 minutes) as a bundle of observations made a faster rate (e.g., every 30 second or every minute), and/or at the earlier of a longer-term timer (1 hour) or alarm. In some examples, the datalogger, smart sensors, Motes, or smart modules may be adapted to execute one or more data processing algorithms using the sensor data. In some examples, the datalogger, smart sensors, Motes, or smart modules may be adapted to manage certain aspects of a repair process, including enabling a remote supervisor to oversee the work of less qualified service personnel.

According to certain aspects, multiple evaluation periods may be defined in order to determine whether a repair is persistent. These evaluation periods may be contiguous and the performance of a repaired refrigeration asset may be evaluated independently during each evaluation period. In some instances, one or more evaluation periods may overlap. For example, first and second evaluation periods may both commence immediately after repair of the refrigeration asset. The second evaluation period may span a longer interval of time than the first evaluation period.

Configurable parameters may be used to determine the duration of the monitoring period used to evaluate the persistence of a repair. Persistence may be measured over time and one or more parameters may dynamically adjust the persistent threshold to account for normal mechanical degradation and/or changes in configuration or environment. In some instances, one or more additional "persistence" baselines may be established for one or more attributes. The persistence baseline may be compared with the post-repair, pre-repair and/or normal baselines to determine if the repair persisted over the specified monitoring period. If the repair persisted, the repair process may be deemed complete. If the repair is not effective or does not persist, a decision to attempt another repair of the refrigeration may be made. The decision may rest upon differences observed in the various baselines related to previous repairs, improvements or degradations in performance and any new information obtained during previous repairs to the same, similar or comparable systems. Persistence of a repair may be based on a comparison mechanical or energy performance to a set point, benchmark, rule, method or standard.

Certain calculations using the baselines derived from or established for peer groups and the post-repair baselines may enable the system to flag the repairs as either effective or persistent based on the time frame during which the calculations are performed. The peer group may establish and/or define acceptable values for various attributes to be monitored. The peer group may account for in-situ variables to enable the evaluations to calibrate for the actual refrigeration system that is being repaired. The in-situ variables may include operational parameters such as set point, airflow, supplied power, power quality levels, and ambient temperature. Leveraging pre-repair snapshots may enable an accurate evaluation of the effectiveness and persistence of repairs.

In some instances, a refrigeration system may be selected for repair based on an analysis of performance data and/or in comparison to Meta Data. Meta Data may include repair codes and repair costs, for example. The selection process, pre-repair, post-repair, persistence and other baselines may be used to modify repair processes and/or to devise new repair strategies, improved repair strategies, policies or standard operating procedures.

Asset tagging features and methods may be employed to facilitate management of the repair process. Asset tagging features may be used to correlate sensor measurements, Meta Data and measured, estimated or calculated performance of refrigeration systems. Asset tags may be added, deleted and/or changed in a manner that characterizes the state-of-health of a refrigeration system and status of repairs associated with the refrigeration system. In one example, asset tagging may include a status indicator that can be incremented, decremented, or otherwise modified to indicate progress, status, state of a repair and/or or changes in performance. The asset tag may be used to control a service provider's next action or response. In this manner, the service provider may remain engaged and accountable until the repair is deemed effective and/or persistent, as determined by desired or targeted levels.

To facilitate efficient repair and maintenance practices, the repair process may be managed and controlled in stages, with gates that allow or disallow further actions. The gates may be operated based on successful completion of previous states, events or outcomes. Progress may be measured based on the current stage of the repair process. In one example, payment of a service provider invoice may be conditioned on the inclusion in the Invoice of a system-issued code indicating the effectiveness or persistence of the repair In some instances, changes or improvements in performance of a refrigeration system, or lack thereof, may be reported before, during or after service, maintenance or repairs. Effectiveness of a repair or maintenance may be automatically determined based on whether improved or expected levels of performance are measured after the repair and/or maintenance. Information identifying the status, effectiveness and/or persistence of repairs and/or maintenance may be provided on a dynamic display of system status. For example, performance of a population of refrigeration systems may be tagged with a qualitative color code, highlights or other means to identify failing, underperforming, and repaired refrigeration systems. The status of ongoing repairs may be highlighted until the repair is deemed persistent. Historical information, including status performance levels and repair codes may be provided in an alert, alarm and/or scheduled or ad-hoc report.

Various aspects disclosed herein may be implemented in a distributed computing system. In one example, a field service technician may be equipped with a portable computing system that can communicate with a local or remote application server. The portable computing system may maintain copies of information related to systems to be repaired. In one example, the portable computing system may maintain or have access to various baselines associated with an underperforming or defective refrigeration system. The portable computing system may maintain information including sensor measurements and Meta Data that can be processed in real-time. The results of such processing may be provided to a networked resource that is configured or adapted to perform detailed analysis of the information and provided profiles and baselines to be evaluated by more skilled individuals or decision support systems. The portable computing system may provide the repair technician with real-time results of the repair and feedback from network resources. The portable computing system may provide a field service technician with instructions regarding services and repairs to be performed. In some instances, the portable computing system may notify the field service technician when repairs are deemed effective and/or persistent. In some instances, the portable computing system may provide instructions or suggestions from another skilled or specially trained person or manager.

In some embodiments, information may be generated that document energy efficiency and savings. Such information may be used to determine appropriate or contracted utility energy rebates and incentives. For example, reports may be generated that determine the amount of incentive or rebate due by calculating energy savings or net energy savings by adding, and/or by subtracting all energy gains and losses over a defined time period for each asset. The calculations related to an incentive or rebate may be based on rules and methods set by an energy provider. A total energy savings or efficiency for all monitored assets may then be used to calculate rebates and incentives by applying a rate or factor representing the amount of incentive or rebate due for each unit of energy saved or lost over a prescribed period. In some instances, energy savings may be projected over a long period of time to determine the incentive payment due from a utility for the specified period of time, based on projected performance which may include adjustments to account from normal mechanical degradation and other factors likely to occur during such period.

In some instances, the status information regarding a repair or maintenance event may be used to generate and invoices. In one example, an invoice issued by a service provider may include a system-generated code that confirms the performance levels of a repaired refrigeration system, effectiveness and/or persistence of a repair. The code may be interpreted by a customer as confirmation that the repair or maintenance has achieved a desired level or result. The desired level or result may be based on the achievement and/or persistence of improved levels of health, reliability, and energy efficiency or that it may have done so for a period of time.

Figure 11:
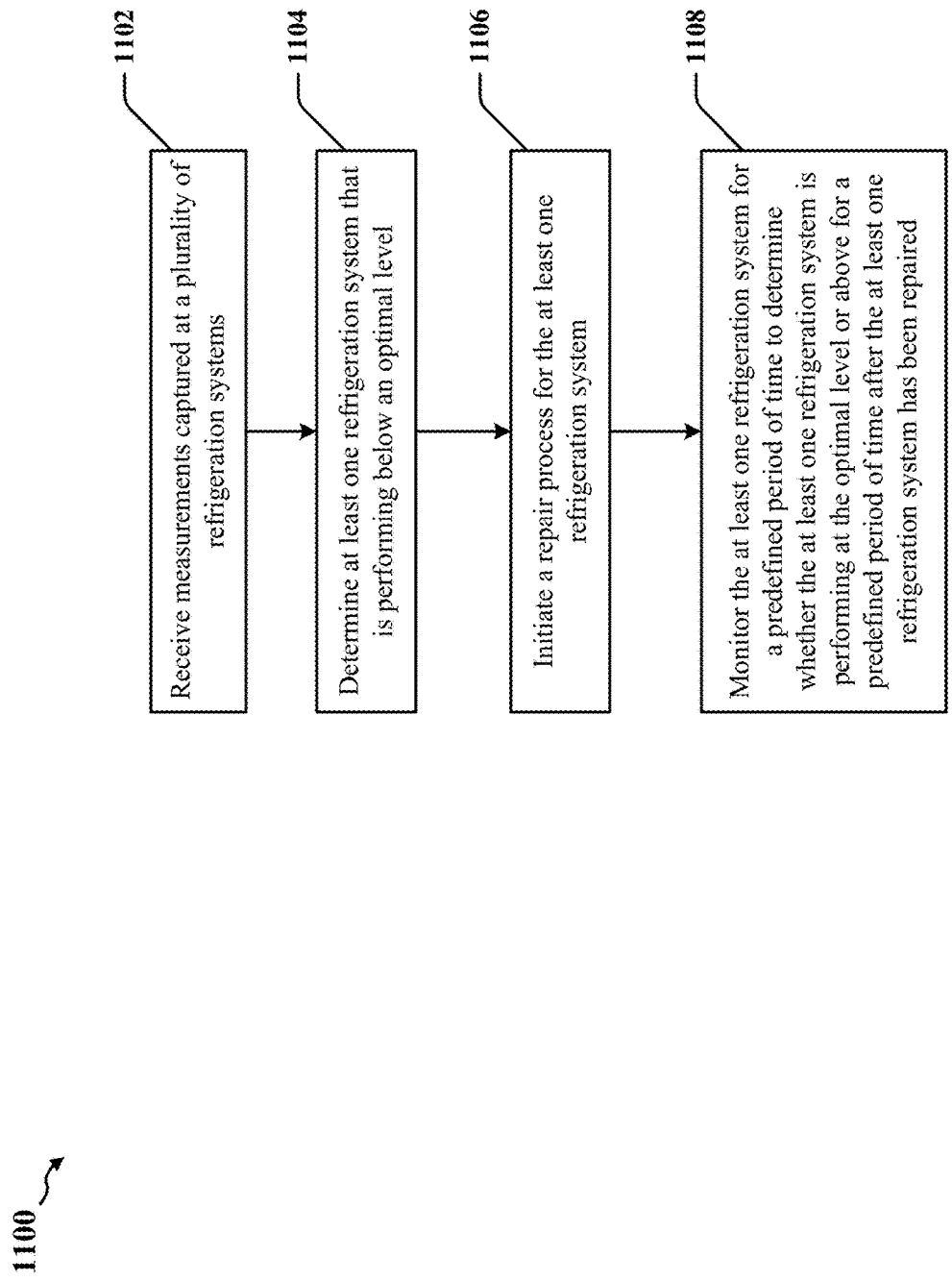
FIG. 11 is a flowchart illustrating a first example of a method of managing the effectiveness of repairs in refrigeration assets.

FIG. 11 is a flowchart illustrating a method for managing and controlling a network of refrigeration systems. At step 1102, measurements captured at a plurality of refrigeration systems are received. The measurements may include measurements of temperatures and energy consumption and compressor performance that characterize the performance of each of the plurality of refrigeration systems. The measurements may be captured at the plurality of refrigeration systems by a plurality of smart sensors configured to communicate the measurements through a network, or may be manually entered or programmatically uploaded into the system by other means. At least one of the plurality of smart sensors may be configured to communicate statistical information based on measurements of performance of a refrigeration system associated with the at least one smart sensor. At least one of the plurality of smart sensors may be configured to communicate analytical information based on a statistical analysis of measurements of performance of a refrigeration system associated with the at least one smart sensor.

At step 1102, at least one refrigeration system that is performing below an optimal level may be identified or determined. The optimal level is determined based on a comparison of the performance of a reference population of refrigeration systems identified in a history of prior measurements.

At step 1102, a repair process for the at least one refrigeration system may be initiated.

At step 1102, the at least one refrigeration system may be monitored for a predefined period of time to determine whether the at least one refrigeration system is performing at the optimal level or above for a predefined period of time after the at least one refrigeration system has been repaired.

Figure 12:
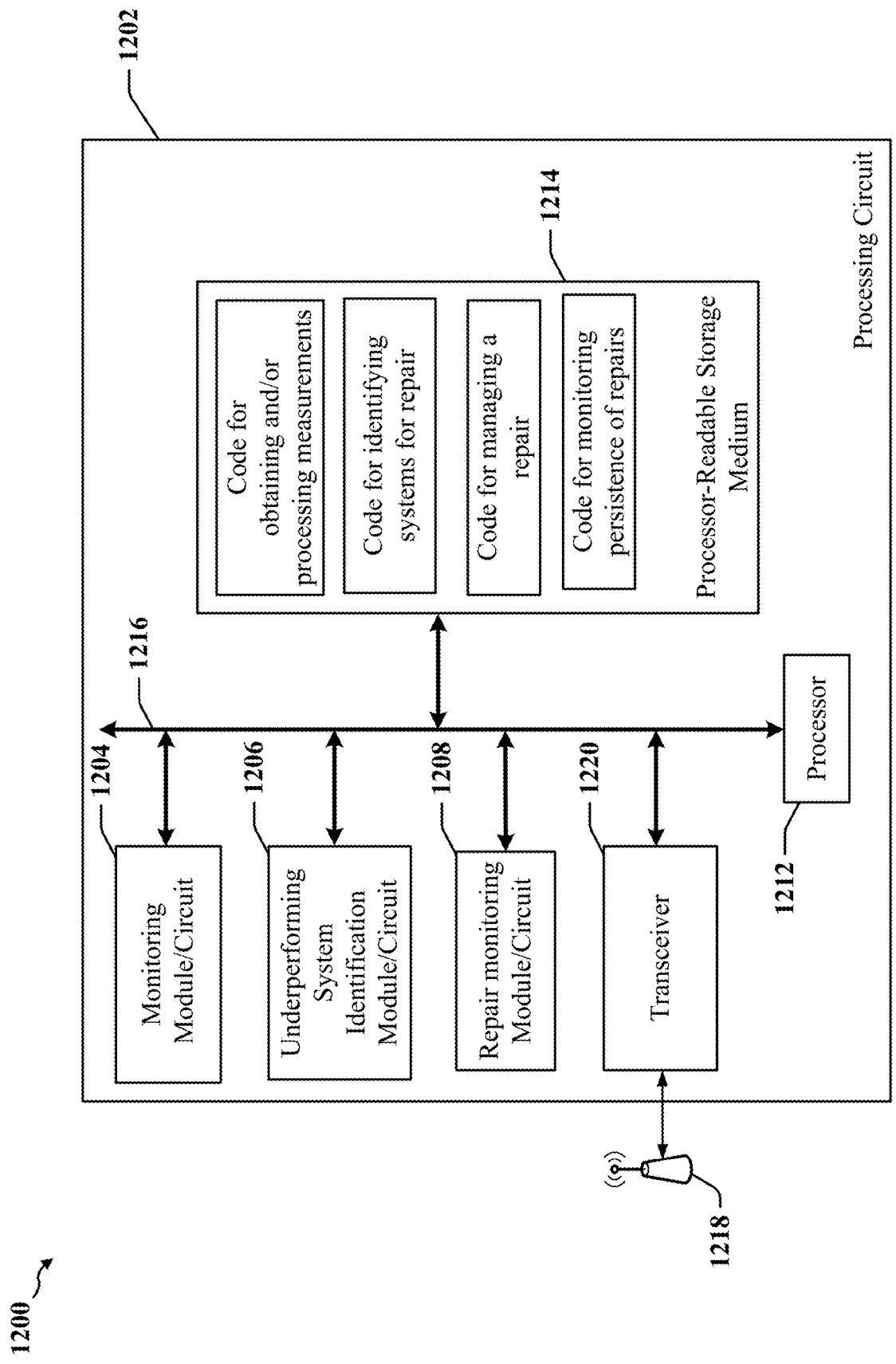
FIG. 12 is a diagram illustrating an example of a hardware implementation for an apparatus adapted to manage the effectiveness of repairs in refrigeration assets.

FIG. 12 is a conceptual diagram illustrating an example of a hardware implementation for an apparatus 1200 employing a processing circuit 1202. In this example, the processing circuit 1202 may be implemented with a bus architecture, represented generally by the bus 1216. The bus 1216 may include any number of interconnecting buses and bridges depending on the specific application of the processing circuit 1202 and the overall design constraints. The bus 1216 links together various circuits including one or more processors, represented generally by the processor 1212, and computer-readable media, represented generally by the processor-readable storage medium 1214. One or more timers may be connected to the bus and/or may be directly accessible or embodied in a processor 1212. The bus 1216 may also link various other circuits such as timing sources, timers, peripherals, voltage regulators, and power management circuits. One or more transceivers 1220 may provide wired communications, or wireless communications through the operation of at least one antenna 1218. Depending upon the nature of the apparatus, a user interface may be provided to support devices such as a keypad, a display, a speaker, a microphone, a joystick, and the like.

The processor 1212 is responsible for managing the bus 1216 and general processing, including the execution of software stored on the processor-readable storage medium 1214. The software, when executed by the processor 1212, causes the processing circuit 1202 to perform the various functions described supra for any particular apparatus. The processor-readable storage medium 1214 may be used for storing data that is manipulated by the processor 1212 when executing software. The processor-readable storage medium 1214 may also be used for storing system information related to one or more remotely managed devices (e.g. profiles), and the apparatus 1200 itself.

In one configuration the processing circuit 1202 may perform one or more functions in a system configured to monitor and/or manage a population of refrigeration systems. The processing circuit 1202 may include a module or circuit 1204 configured to receive measurements captured at a plurality of refrigeration assets, a module or circuit 1206 configured to determine at least one refrigeration system that is performing below an optimal level, a module or circuit 1208 configured to initiate a repair process for the at least one refrigeration system. The module or circuit 1204 may be further configured to monitor the at least one refrigeration system for a predefined period of time to determine whether the at least one refrigeration system is performing at the optimal level or above for a predefined period of time after the at least one refrigeration system has been repaired.

Monitoring, and Optimizing Efficiency of Refrigeration Systems

Figure 13:
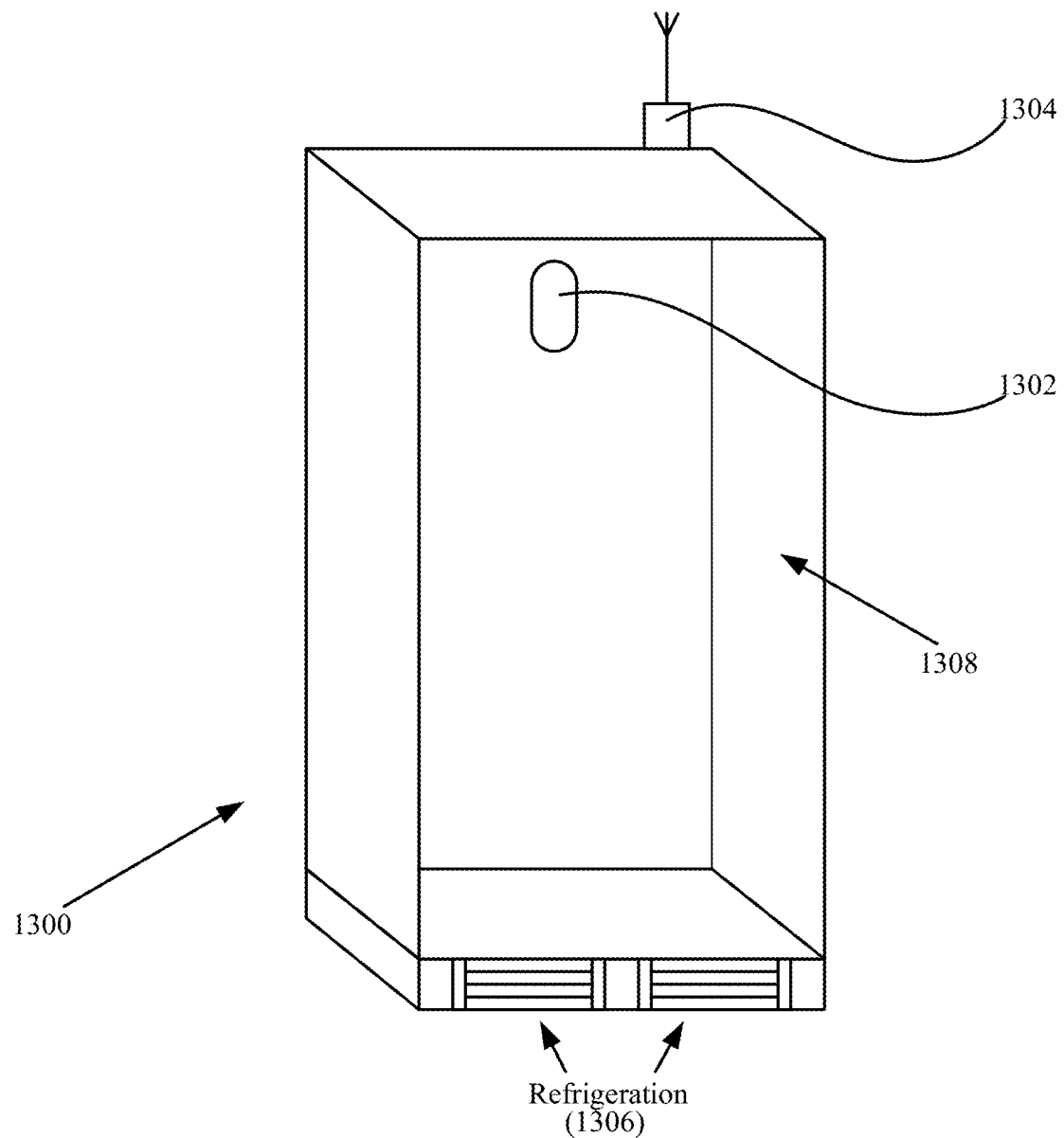
FIG. 13 illustrates a refrigeration unit subject to monitoring according to certain aspects disclosed herein.

FIG. 13 is a simplified representation of a freezer 1300 that is monitored according to certain aspects of the invention. The freezer 1300 has an internal compartment, shown generally at 1308 that is maintained at a desired temperature by a refrigeration device 1306. For example, refrigeration device 1306 may operate using a thermodynamic refrigeration cycle such as the Carnot cycle and may comprise one or more compressors, condensers, evaporators 1306. Refrigeration device 1306 may employ a charge of a refrigerant, such as Freon. It will be appreciated that a thermodynamic refrigeration cycle can serve as a refrigerator and/or as a heat pump. Accordingly, certain aspects of the present invention may be applied to heating and cooling systems. However, for the purpose of facilitating the appreciation of the presently disclosed inventions, a refrigeration device 1306 will be assumed to operate using Freon in order to achieve deep cooling of a compartment 1308 used to store items and materials which may include, for example, biological samples. It will be appreciated that the invention may be used in commercial food storage systems, consumer equipment and any other refrigeration system or system that uses a heat pump. In one example, an optimal and/or desired practical operating temperature for a ULT freezer is approximately −80° Celsius. The selection of operating temperature is typically made based on application requirements and operational limits of the refrigerant or other component of system 1300. In the example of a ULT Freezer using a Freon refrigerant, the Freon-based thermodynamic cycle typically has a lower operating temperature limit of −86° Celsius.

It will be appreciated that the refrigeration device 1306 may include plural component parts, some of which may be installed within and/or adjacent to compartment 1308. Certain embodiments employ a thermally sensitive instrument 1302, typically in thermal communication with the storage compartment 1308, to measure temperature within a compartment 1308 of freezer 1300. Accordingly, at least a portion of instrument 1302 may be provided within the compartment 1308 to permit accurate measurements of temperature within compartment 1308. Other methods for measuring temperature may be employed in accordance with certain aspects of the invention.

Thermally sensitive instrument 1302 can be electrically or electromagnetically coupled to a controller 1304, which is generally located outside the cooled interior of the refrigeration system 1300, primarily to ensure an ambient temperature for electronics components that is within operational tolerances of electronics devices. Thermally sensitive instrument 1302 typically comprises a thermal sensor 1302, such as a thermocouple or thermometer and a controller 1304 that can be mounted externally to the freezer 1300. Certain refrigerators and freezers are manufactured with temperature measuring sensors installed in the compartment 1308 and, in some embodiments, such sensors can serve as instrument 1302.

Location of the controller 1304 may be selected to facilitate access to power, for optimal wireless communication and/or for easy access during setup and maintenance. Controller 1304 may include one or more processors, storage and means of communications as will be addressed in more detail below. Placement of the controller 1304 on the outside of the freezer serves to ensure any contents inside of the compartment 1308 will not damage the sensor 1302 or inhibit transmission of the readings. In some embodiments, controller 1304 may comprise a wireless transmitter. However, sensor 1302 may employ hard-wired or other communication means instead of, or in addition to, a wireless transmitter. Controller 1304 can be powered by internal battery and/or from an external power source or supply.

In certain embodiments, controller 1304 may receive temperature measurements from one or more sensors 1302 and may transmit accumulated temperature readings representing conditions within at least one compartment 1308 over a predefined time interval. It is contemplated that some controllers 1304 may be configured to relay temperature measurements without processing and/or may relay temperature measurements when contacted by another controller (not shown), gateway and/or accumulation device, regardless of the amount of data accumulated by the controller 1304.

Figure 14:
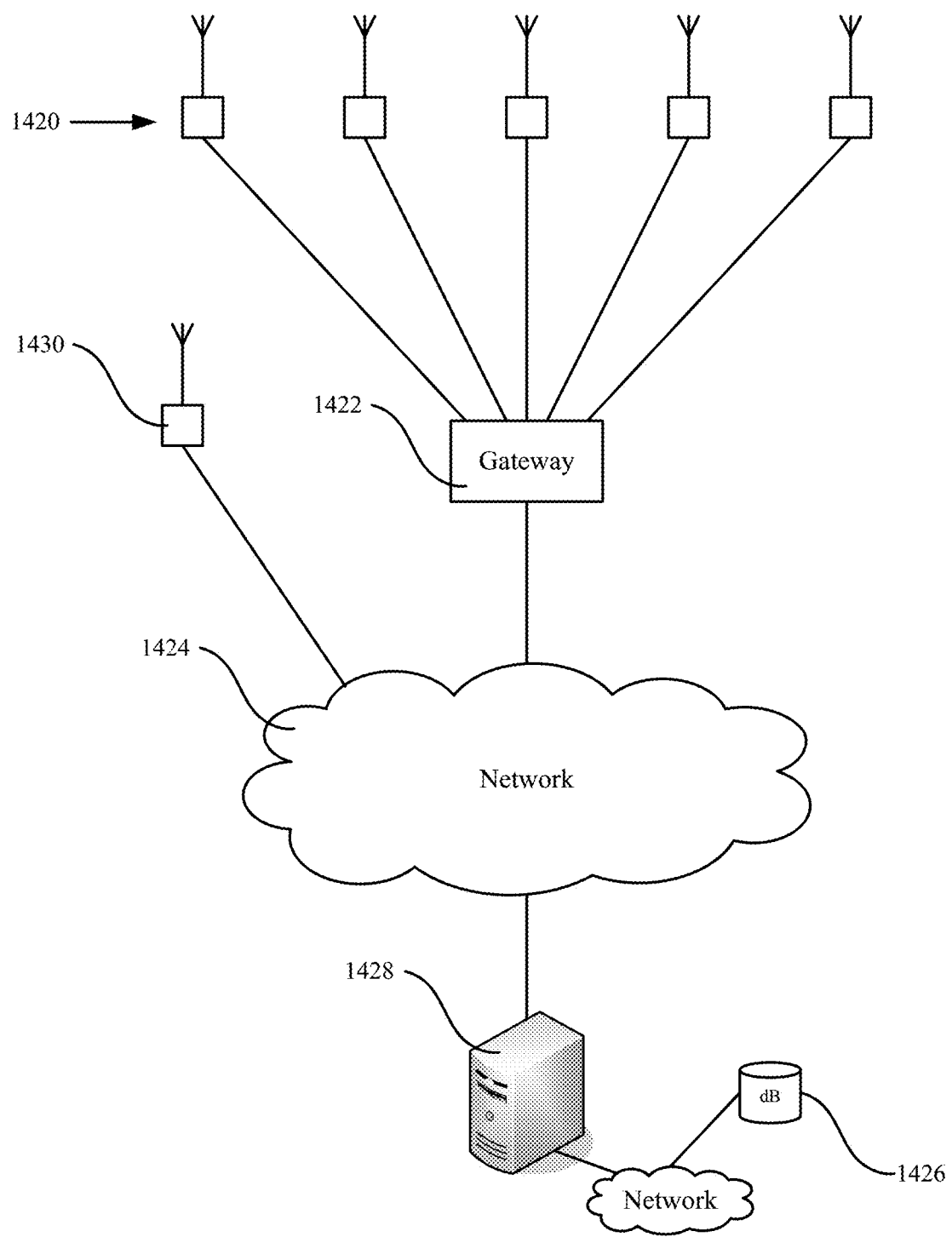
FIG. 14 illustrates examples for flow of data according to certain aspects disclosed herein.

With reference to FIG. 14, temperature measurements can be sent from controllers 1420, 1430 via a network 1424 to a processing system 1428, which may include one or more computers and/or servers. Controllers 1420 may provide information, including temperature measurements, to a gateway 1422, to minimize complexity of each controller 1420 and/or to improve communications efficiency. Gateway 1422 can typically receive the data and may optionally pre-process the data into data sets which are then sent to an application server 1428 for processing. In one example, gateway 1422 packages 10 to 20 measurements per device 1420 into a data set for transmission through network 1424. Application server 1428 can comprise a database 1426 such as, for example, a schema-less database.

In certain embodiments controller 1430 may communicate directly with network 1424 without an intervening gateway 1422. Typically, a controller 1430 that can communicate directly with the network is configured to accumulate and order at least some measurements. Controller 1420 or 1430 may connect to network 1424 using one or more repeaters, radio signal amplifiers, a mesh network and/or other sensors 1420, 1430 configured to perform relay functions. Accordingly, the range of sensor 1420, 1430 can be extended if the distance between the sensor 1420 or 1430 and the gateway 1422 exceeds the transmission capabilities of the sensor 1420 or 1430. It will be appreciated that one or more sensors 1420 or 1430 may be connected to a wired network and may communicate with gateway 1422 and/or server 1428 using a LAN, WAN, Internet, Intranet, Extranet or other network. Moreover, a wired controller 1430 may be configured in some embodiments to relay measurements transmitted wirelessly from other sensors.

Figure 15:
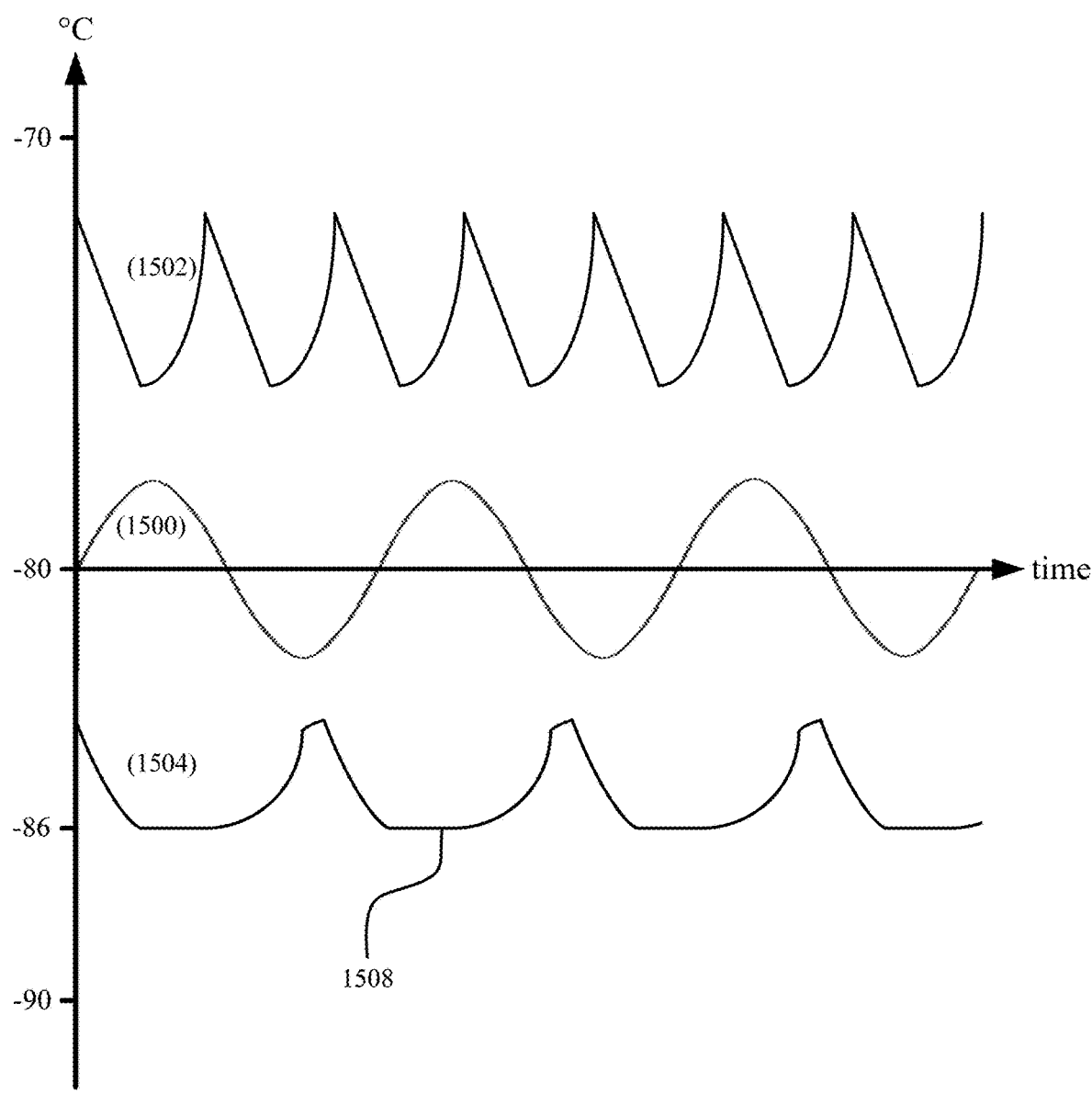
FIG. 15 illustrates an example of a temperature profiles for refrigeration units according to certain aspects disclosed herein.

FIG. 15 depicts illustrative examples of profiles generated from temperature measurements for one type of refrigeration unit. These profiles are typically generated from temperature data captured over a period of time, and analysis of the temperature data can be used to determine freezer performance over the time period. Baseline profiles can be obtained as an aggregate of profiles of a plurality of similar freezers and/or from a freezer that is functioning within rated specifications. In particular, temperature cycles within the compartment can be characterized using statistical and pattern analysis techniques to derive a steady-state characteristic of temperature within the compartment.

A baseline value for a population of freezers of various manufacture and models can be established by comparing the plotted curves of each unit to one another in order to establish a normalized average pattern. A baseline can also be established using previously captured data obtained from a similar model freezer or group of freezers known to be running at nominal and/or optimal performance levels. Baseline data can be provided by a user and/or by download from a networked repository of baselines. Baseline data can be used for comparison with a temperature profile captured from an individual unit and the comparison may then yield information correlated to the health of the individual unit. Many approaches in establishing a baseline are conceivable, and some of these approaches may be user-defined. In certain embodiments, any appropriate comparison metric may be used. In one example, the comparison metric may comprise a statistical moving average.

In FIG. 15, an idealized and simplified baseline profile 1500 of a freezer operating at optimal conditions is generally sinusoidal. The sine curve oscillates about $-80°$ Celsius and has a consistent amplitude with minimum and maximum values of $-84°$ Celsius and $-76°$ Celsius, respectively. In this example, the refrigeration cycle may be considered to be active while the internal freezer temperature is greater than $-80°$ Celsius and is disabled when the temperature is at, or below the nominal operating temperature of $-80°$ Celsius. Because of thermal inertia within the freezer, temperature continues to change after the refrigeration cycle transitions between on and off. It will be appreciated that the volume and mobility of air within the freezer typically dictates the frequency of oscillation of temperature. Accordingly, the sample rate of temperature may be adjusted based on frequency of oscillation. Typically, at least two temperature readings per time period is required to capture frequency of oscillation, although more samples are generally required to identify the form of the curve, harmonic frequency content and step functions attributable to events, malfunction, etc.

Variations of maximum, minimum and median temperatures from nominal values, and/or shape of sections of the temperature characteristic can be used to assess the efficiency of the thermodynamic cycle and to indicate potential operational deficiencies of the refrigeration equipment. Temperature measurements can be analyzed and compare the freezer's performance to a baseline or stages during operation. Analysis of continuous temperature readings taken from individual freezers or groups of freezers can provide data or a pattern of temperature profiles that can be used to optimize power usage, schedule maintenance visits and generate alarms.

Signal analysis can be performed on a temperature profile using, for example, a statistical model. For example, a profile may indicate a peak representing a maximum temperature that terminates a rise from minimum to maximum values. The peak may be calculated as a statistical maximum. The profile may also indicate a minimum temperature terminating a fall in temperature as compartmental temperature is regulated. The minimum temperature may be calculated as a statistical minimum. In one example, the statistical maximum and minimum values may be calculated using a moving average. A statistical model can distinguish a true maximum and/or minimum temperature from other peaks and troughs in temperature identified within the profile. It will be appreciated that a variety of data filtering and analysis tools are known that can be applied to extract statistically significant characteristics of the profile. Such statistically significant characteristics can be used to manage freezer health.

The characteristics of a unit's temperature profile can be used to diagnose potential problems with refrigeration and other devices and can also be used to identify failing components. Advantageously, data can be obtained using wireless sensors from one or more refrigeration devices and the data can be characterized and categorized according to known correlations. As discussed above, the example of FIG. 15 provides a profile 1500 representing a freezer operating at optimal conditions. FIG. 15 also shows a profile 1504 that is a simplified example of compressor saturation when temperature within the freezer reaches the operational limit of Freon at −86° Celsius. It will be appreciated that profile 1504 most likely represents a system in which the thermostat is set just above −86° Celsius and that the compressor continues to operate without effect until temperature within the freezer stabilizes at −86° Celsius or the temperature surrounding the thermostat reaches the set desired temperature. Clearly, the system represented by profile 1504 is operating inefficiently because the compressor operates without producing useful work.

A profile 1502 with a higher frequency, more rapid refrigeration cycles, in comparison to the baseline 1500, might be attributed to an incorrectly calibrated freezer relative to its storage capacity. Observed temperatures that fall outside a range of internally calibrated temperature ranges may indicate one or more problems including, for example, a Freon leak through a valve or through a deteriorating seal, lack of Freon circulation due to a clogged capillary tube, an inefficient or damaged condenser fan, a clogged filter, obstructed condenser coils, worn compressor valves, and/or other mechanical failure. A greater amplitude of oscillation during a compressor cycle may indicate a transfer of energy between the freezer and the surroundings in the form of heat resulting in increased power usage. A rise in temperature results in more current being drawn through the unit. An irregular spike in temperature can indicate damaged insulation within the compressor coil. As discussed herein, deviations from a normal or ideal temperature characteristic can be correlated with dysfunctions of the cooling system 1306, inadequate air circulation within the compartment 1308 of refrigerator or freezer 1300 (see FIG. 13). Correlations of dysfunction with observed temperature cycles are enabled in certain embodiments of the invention by observing, recording and analyzing temperature variations in a plurality of refrigeration devices over prolonged periods of time.

Figure 16:
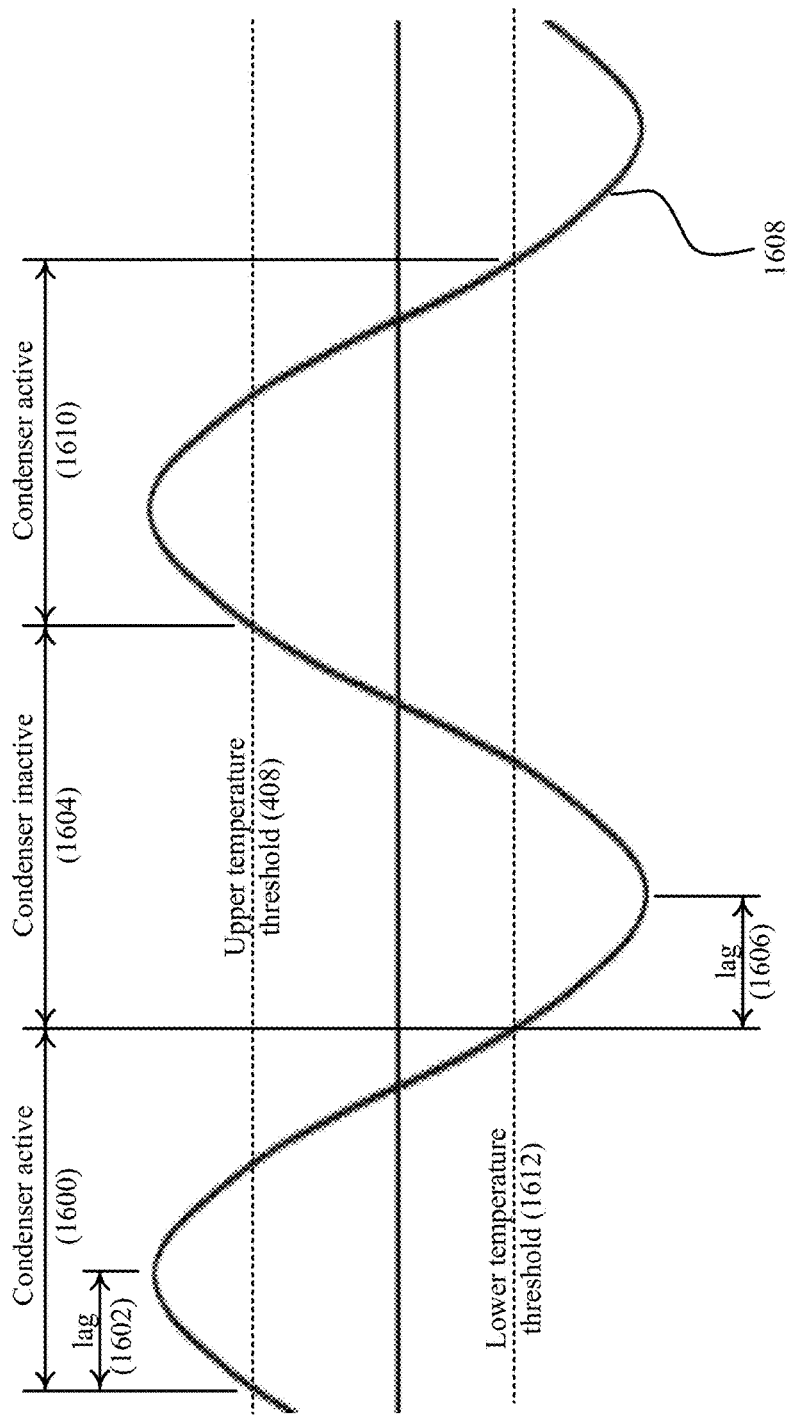
FIG. 16 illustrates an example of a condenser cycle within a temperature profile according to certain aspects disclosed herein.

FIG. 16 depicts an example of a temperature characteristic 1600 of an idealized freezer compartment monitored according to certain aspects of the invention. The characteristic 1600 identifies certain inferences that can be drawn regarding condenser and compressor cycles. As depicted, the characteristic is substantially sinusoidal having a phase shifted half-cycle 1600 that corresponds to a period when the condenser of the freezer is active, followed by a half-cycle 1604 when the condenser is inactive. Condensers function to cool the refrigerant, such as Freon, and convert the vapor into a liquid while at a constant temperature and pressure.

The phase shift between temperature characteristic 1600 and the condenser half-cycles 1600 and 1604 can arises because of lags 1602 and 1606 in measured temperature response to compressor transitions between active and inactive, air flow within compartment 1308 and for other reasons. In typical applications, condenser half-cycles 1600 and 1604 may be affected by other stages and characteristics of a refrigeration cycle, such as flash point evaporation and movement of the refrigerant through the evaporator. Transition between condenser half-cycles 1600 and 1604 may be correlated with a point in time before the highest temperature observed and corresponding to the crossing of an upper temperature threshold 1608. Transition between condenser half-cycle 1604 and next compressor active half-cycle 1610 may be correlated with a point in time before the lowest temperature observed and corresponding to the crossing of a lower temperature threshold 1612.

In certain embodiments, compressor activity can be inferred from the temperature characteristic 1600. In the symmetric example of FIG. 16, temperature characteristic 1600 is symmetric and phase shifts 1602 and 1606 can be assumed to have an equal length of time and effectively ignored. Therefore, it can be inferred that the condenser is turned on for 50% of the time. In other instances, the ratio of active and inactive condenser periods may be non-unitary and the resulting temperature characteristic is likely to non-sinusoidal but is likely to be periodic. Accordingly, signal analysis techniques may be employed in some embodiments to extract a fundamental frequency of the refrigeration cycle and to identify other cycles that can be attributed to condenser activity and inactivity. In some embodiments, analysis of the temperature characteristic may identify acceleration/deceleration of rate of change of temperature within a half cycle of the temperature characteristic; these changes in acceleration and/or deceleration, and general trends in the temperature characteristic before such changes can be used to identify compressor on/off transitions.

Other functions of a refrigerator may be identified from the temperature characteristic. For example, changes in the characteristic and/or the presence of certain harmonic frequencies may indicate when a pump is engaged, when refrigerant vapor is compressed and/or superheated. Long term changes in an observed temperature characteristic can be predictive of refrigeration system failure or loss of energy efficiency. For example, progressive deterioration of mechanical parts can lead to changes in the temperature characteristic (e.g. increased cycle frequency) that are detectable, given sufficient lapsed time. The rate of change and the manner of change can indicate impending loss of efficiency or failure based on similar changes previously observed other refrigeration devices.

It is also contemplated that the relationship between multiple connected compressors within a freezer can be identified by analysis of a temperature characteristic. In one example, the high-pressure output stage of a first compressor can be coupled to the low-pressure input stage of a second compressor. In another example, refrigeration systems may operate in parallel. Other refrigeration component combinations are contemplated. The relationship between the coupled compressors can be identified in a single temperature characteristic obtained from a freezer, while the state of health of each individual compressor in the combination may be inferred. As discussed herein, the cooling devices of some commercial refrigerators and freezers are instrumented such that direct temperature readings from compressors, evaporators and Freon lines may be obtained and used to augment temperature readings obtained from within the compartment 1308. Such direct readings can be useful in isolating specific components in predictive failure analyses. Certain embodiments develop information regarding relationships between direct readings and measured compartment temperatures; such relationships may be used to identify problems with heat transfer elements and airflow with a compartment 1308.

The attribution of potential problems to specific refrigeration units and/or component can be achieved in certain embodiments of the invention. In particular, the use of indirect temperature and/or electrical current measurements can determine the financial cost and benefit associated with each refrigeration unit. Measurement of electrical current can supplement cost/benefit analysis. For example, condenser activity may be accurately characterized for a plurality of freezers and such characterization may be used to estimate power usage, based on rated current usage of the condensers. However, a malfunctioning or laboring condenser may consume considerably more power than a nominally operating condenser. Therefore, in certain embodiments, the monitoring of a population of refrigeration/freezer devices can include measurement or estimation of electrical current usage and the effects of dysfunctional refrigeration components on power consumption. Information developed from such monitoring can be used to correlate electrical current readings to power consumption of condensers. For example, information from monitoring can be used to determine the amount of electrical current drawn by a condenser and the temperature characteristic for the refrigerator can be used to determine the amount of time that the condenser is active.

Electrical current usage of the condensers can be characterized for each individual freezer, for makes and models of freezer and can electrical current can be measured on a continuous or periodic basis. In certain embodiments, current measurements can be obtained for a freezer or refrigerator that is operating at designed efficiencies. These measurements can be correlated with temperature measurements for the refrigerator and freezer and can serve as a baseline for monitoring energy efficiency and for predicting failure.

Electrical current usage may be used to calculate power consumption by the refrigeration unit. The active power P required by a refrigeration unit operated at V volts and drawing I amps, is calculated as P=IV Power used is then calculated as $PT_{ON}$ Watt Hours (typically stated as kilowatt hours), where $T_{ON}$ is the fraction of each temperature cycle when the compressor is active and drawing current. It will be appreciated that actual power usage may be obtained by scaling active power P with known power factors of the compressor or compressor type. Thus, calculation of power consumption by a freezer requires knowledge of current used by the refrigeration unit.

In certain embodiments, current load for an individual freezer may be determined or inferred, given that the power cycling properties of the freezer are predictable and/or determinable. In certain embodiments, electrical current measurements can be obtained for each refrigerator or freezer. In certain embodiments, current is measured at a power distribution panel, or on a power line that supplies current to multiple refrigerators and/or freezers. Baseline measurements of electrical current drawn through a circuit supplying two or more refrigeration units or freezers can be used to determine the load of each refrigeration unit or freezer. Given sufficient time and data points, a periodic measurement of current in a circuit that feeds plural freezers can provide sufficient information to discern the contributions of current use by each of the freezers. Typically, variations in current measured at the power source can be correlated with temperature characteristics measured simultaneously at each of the freezers, thereby attributing current usage by refrigeration unit or freezer.

Temperature and current correlations may be determined using a variety of techniques. In a simple example, when a temperature characteristic shows that a selected freezer is in a warming phase, it can be assumed that the selected freezer is drawing no current. When the selected freezer begins a cooling phase, any increase in measured electrical current may attributed to the selected freezer, if no other freezer has transitioned from "on to off" or from "off to on." Given sufficient data points, the individual contribution of each freezer can be calculated based on identified combinations of "on and off" freezers. It is frequently more convention to perform a frequency domain analysis of measured electrical current flow to find correlations with temperature cycles of refrigerators or freezers that receive the electrical current. In a simple example, if four freezers are provided electrical current from the same power outlet, and the compressors of the freezers operate at different frequencies, it would be sufficient to use a notch filter tuned to the frequency of a selected freezer to measure the amplitude of current attributable to the selected freezer. However, current and temperature data are typically analyzed using well-known signal analysis techniques.

Attribution of current consumption by individual freezers may include the use of various algorithms that identify variations in current usage over a refrigeration cycle and can provide an average electrical current flow and percentage "on" time for each compressor. Having determined electrical current usage and "on-time" for each refrigeration device, a user can determine power usage for each freezer over time, in comparison to other systems, and in comparison to benchmarks and/or nominal operating specifications. Thus, a single electrical current measurement device can provide insight into the efficiency of multiple systems. Indirect estimation of electrical current load drawn through an individual unit can also allow for a measurement of efficiency based on energy consumption when compared with a healthy unit.

In certain embodiments, methods for calculating power usage include measuring electrical current in a power line that supplies a plurality of freezers. Electrical current measurements are typically sampled at a sufficient rate to enable correlation of variations in electrical current flow with the characteristics of the individual freezers. A processor or controller can be configured to identify when each compressor is active, typically by analyzing the temperature characteristic for the freezer. At various sample points in time, a list of active compressors can be associated with a current measurement in the common power supply. With sufficient samples, the contribution of electrical current by each compressor can be calculated. This contribution represents electrical current consumed by the compressor and can be used to calculate the power consumption of the freezer based on the ratio of compressor active/inactive period. Accordingly, the efficiency of each freezer can be dynamically monitored.

In certain embodiments, a temperature sensor can recognize events relating to changes in temperature and respond by increasing sample rate. An application server may be configured to treat such increased sample rate as an alert for the corresponding freezer. It is contemplated that an alert may be triggered by any of a plurality of events, including detection of compartment temperature rising above one or more thresholds, temperature remaining above a maximum threshold for a predetermined amount of time, changes in rate of change of temperature and step changes in temperature. Similarly, alerts may be generated based on abnormal or sudden increase in current consumption. An alert related to temperature rising above a threshold can often be attributed to the door being opened. If the temperature readings remain at or exceed the maximum temperature, the freezer door may have been left open, and/or complete compressor failure may have occurred. Events may also include temperature range shifts from statistical norms for the freezer, often attributable to a failing or laboring compressor, incorrect calibration and/or changes in environmental conditions. For example, a compartment of a freezer may be overloaded given its storage capacity, and therefore unable to maintain a steady temperature. Alerts are typically sent to a user by Email, text message automated call, notification on a Web page and/or by any other suitable means.

Environmental changes may affect temperature readings and can include the specific placement of a freezer within a room adjacent to an unaccounted-for heat sink. Freezers located near or by a window may display increases in temperature that correlate to a temperature increase due to time of day and/or seasonal weather. The temperature of the room or structure in which the freezer is housed may increase due to improperly functioning or set environmental controls. An increase in temperature readings can also correlate to an increase in current or power usage, as the compressor does more work to maintain compartment temperature. In certain embodiments, a collective efficiency metric can be calculated as power usage per area occupied by freezers. One such metric can be calculated as kWh/sq. ft. and the metric may be used to assess relative efficiency between different makes and models of freezers. The metric may also be used to set thresholds for performance such that a decrease in performance may trigger an alert, generate a service request, etc.

In certain embodiments, portions of data collected by temperature and/or electrical current sensors may be eliminated from consideration when characterizing operation of freezers, when identifying energy inefficiencies and for the purposes of predicting failure. It has been observed that most events, discontinuities and distortions in observed temperature characteristics can be attributed to human activity. Human activity that affects the temperature characteristic includes opening of the freezer or refrigerator, moving of the freezer or refrigerator, vibrations caused by human activity affecting airflow, variations in power supply due to use of electrical equipment and so on. Accordingly, analysis of data may be restricted to certain times of day when humans are not present. For example, freezers in commercial establishments may be monitored during early morning hours.

In certain embodiments, elements of the cooling system may be instrumented. For example, some commercially available freezers are shipped with temperature sensors installed in or around compressors, evaporators and conduits that carry Freon or other refrigerants. Typically, the temperature sensors are wired through a harness to one or more connectors for diagnostic and maintenance. In some embodiments, signals from these additional temperature sensors can be monitored by controllers provided according to certain aspects of the invention. The additional data derived from these signals can be analyzed to obtain additional baseline characteristics and to permit more precise identification of inefficiencies or dysfunction and to predict system failures. For example, temperature readings associated with various aspects of the cooling system can be used to characterize nominal and optimal cooling cycles.

In certain embodiments, a vibration sensor, such as a low frequency accelerometer, can detect vibration of a compressor. Compressor vibration normally occurs as a compressor is cycling on and/or off. The sensor can respond to changes in vibration patterns and/or can compare measured vibration to previously recorded or observed operating norms. Response may include an increased sampling rate which typically is interpreted by an application server as an alert. An alert may be processed when vibration occurs at an abnormal time interval. For example, a longer than normal vibration, or vibration at an unexpected time within the compressor cycle. Extended periods of observed vibration can provide a baseline for normal compressor function. In at least some embodiments, the vibration sensor may detect unusual vibrations that may be attributable to external events such as earthquakes or relocation of a freezer.

In certain embodiments, performance of freezers, compressors and alerts can be presented to users at a console or monitor. Users may access a monitoring system using an Internet application or browser, through a smartphone application, using a computer or tablet, or by any suitable system that supports user interactions with a networked console or control application. By means of a graphical user interface accessed via any Internet browser, user-specific data can be accessed from an application server 28 using a distinct login ID/password. Online macros may score the performance of each freezer. In one embodiment, a letter grade of A, B, C or F can be assigned to compare the unit with a baseline grade or peer performance. For example, freezers assigned a grade of C or F can be marked and shut down for preventive maintenance, while freezers rated with an A or a B grade may be allowed to remain in operation with no planned preventative maintenance.

If preventive maintenance is performed, a user, such as the service technician, can manually enter data into the online system. The user can track potential problems, allowing for intervention before failure occurs. Certain embodiments of the invention may also allow the user to select a logic function to predict future performance. This function can allow the user to input scenarios that project total cost of ownership for each system. The function can also calculate potential savings of economy, if, for example, F-grade freezers were to run at B-grade efficiency levels. By identifying systems with a low grade, total non-operational time for all systems, cost for repair, and risk to the materials being stored can be reduced.

Certain embodiments of the invention can map 2D images, such as a floor plan, of a structure to create a 3D representation of a freezer and other objects housed with varying elevation or user-defined region of the structure. A user can manipulate the 2D image(s), which can be reflected in pseudo-real time in the 3D structure, without the use of a separate animation software. The freezer(s) can be classified within a database to control for use and context, and a hierarchical relationship may be created to simplify management of the freezer(s) and structures. The freezer(s) may be displayed in a single view, including all units on all floors in a structure or multiple structures, or in discrete views by regions. Floors can also be hidden from view in order to simplify multi-floor structures. Certain embodiments can provide further details of a selected 3D view of a floor to be shown in a 2D map, in order to manage information and placement of objects. Other embodiments of the invention can enable the user to manipulate the 3D view, while the objects maintain position relative to an established coordinate system.

Figure 17:
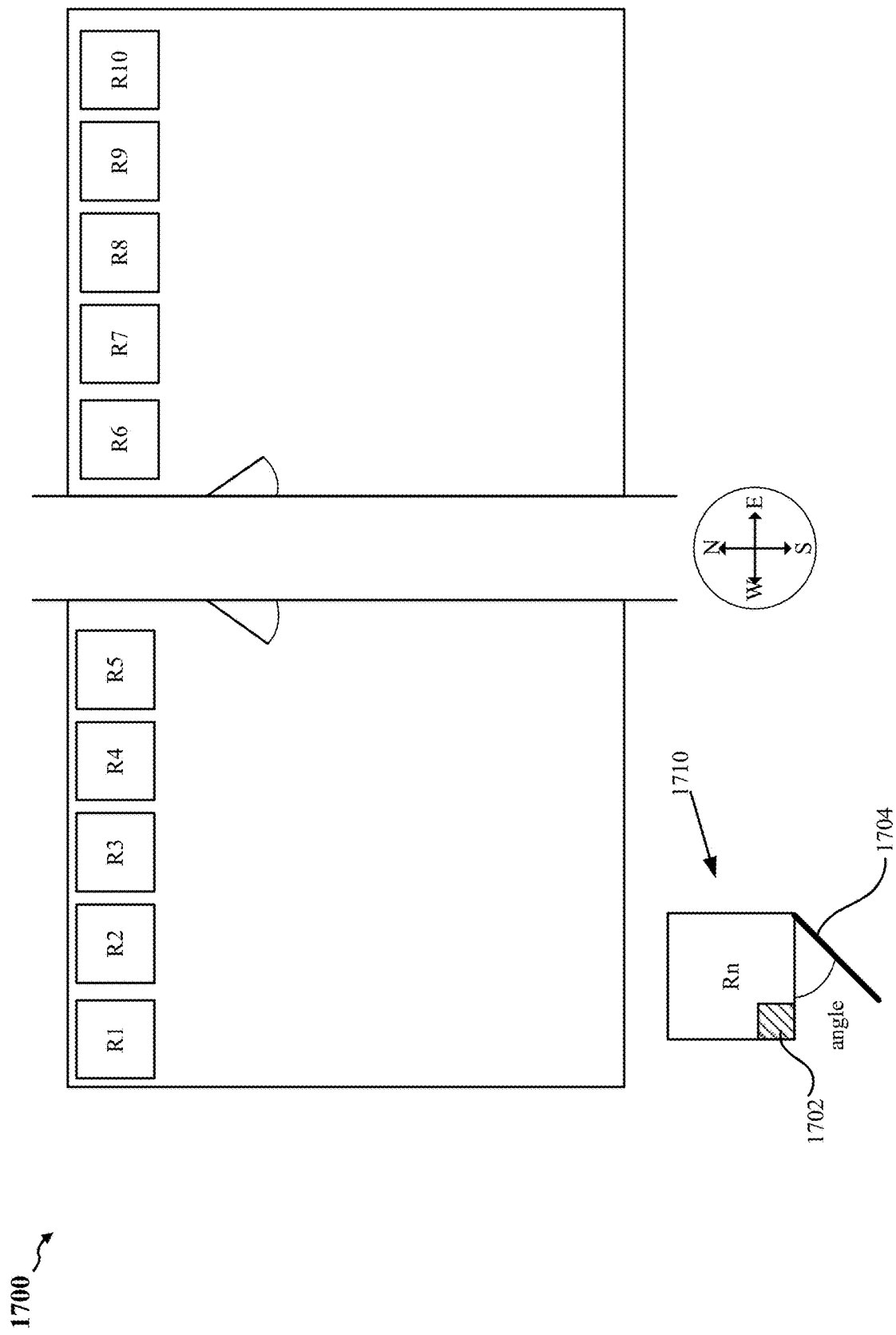
FIG. 17 illustrates an example of a tracking embodiment of the invention according to certain aspects disclosed herein.

Certain embodiments of the invention can also provide a means for monitoring and tracking the location of objects, such as a freezer or multiple freezers R1-R10 within different regions of a structure or in different structures, as shown in FIG. 17. Each freezer can be assigned a distinct icon, relevant identifying information, and strategically incorporated in a virtual layer. A distinct icon can indicate an alarm status by its changed color or an action, such as a spinning or revolving motion. For example, a freezer with an alarm status may be represented by a red icon and/or a spinning icon. In certain embodiments, animation of an icon may correlate to a specific event or type of alarm. For example, a rapidly spinning icon can represent a freezer with an observed increase in energy consumption. A red icon may represent a freezer that has been improperly (re)located within the structure. A blinking icon can represent a freezer while it is being moved.

For each freezer 1700 (generally designated Rn), a device 1702, such as a magnetometer, can be electrically connected to the temperature monitoring device and placed near the freezer door 1704. Readings of a freezer's and/or freezer door's relative position can be transmitted to the application server 1428 by an integrated transceiver or RF transmitter, which may be powered through the use of a current transducer, for example, an inductively coupled device, to utilize power from a voltage supply source to a compressor. The current transducer may also be used to a charge a battery, charge-pump circuit or power any device, display or attached integrated circuit. The information from the magnetometer can be used to determine the orientation of the freezer relative to a wall or structure and monitor when a freezer is moved from one location to another. Readings from the magnetometer can also indicate when the door is open and can account for irregularities in temperature data. Energy is added to the conditioned area when the door is opened and is not an indication of compressor performance to be used in the health analysis of the freezer. In addition to a temperature sensor, integrated transceiver, and current transducer, a comprehensive monitoring unit may also include additional attached digital input devices, such as an attached humidity sensor.

As discussed with reference to FIG. 13, thermally sensitive instruments 1302 can be deployed in a plurality of refrigerators and freezers 1300 to monitor compartment temperatures and to deduce characteristics of performance and efficiency for individual devices 1300 and to predict failure or deterioration in performance. The characteristics are typically derived from information gathered over long periods of time, the information including temperature measurements gathered during that time. Other components of the information can optionally include measurements of electrical current for one or more devices 1300, ambient temperatures of rooms that house devices 1300, compressor/evaporator temperature measurements and other information obtained from other sensors mounted in device 1300, detected exceptions such as freezer 1300 door openings and so on. Observational and maintenance information can be provided by technicians dispatched to service machines, such information including readouts from control systems of device 1300, diagnostic equipment, etc.

Temperature, electrical current and other measurements are typically obtained as samples, taken at a frequency calculated to capture fundamental periods of temperature change. Information obtained from each of the plurality of devices can be used to characterize the performance of the system or device 1300 and may be stored as a set of raw measurements, as averaged characteristics of temperature, electrical current and power consumption. In some embodiments, the measurements may be subjected to a frequency domain analysis to obtain a set of parameters that describes the observed temperature and electrical current curves. Accordingly, the characteristics of a specific refrigerator may be stated as parameters that include a set of amplitudes of a fundamental frequency and its harmonics, one or more phase shifts and one or more transforms, such as a Fourier transform, a Laplace transform, or any other suitable transform. Such frequency domain representation may be particularly useful when seeking patterns in the characteristics of a device 1300 and/or when matching temperature and electrical current measurements, especially where there are fewer current meters than freezers 1300. Statistical analysis and other forms of data processing may be used for characterizing performance and identifying trends or patterns. In certain embodiments, digital signal processors may be used in the probe and/or monitoring system to generate frequency domain representations of temperature characteristics and/or current signals measured in a power line.

Baseline characteristics are typically developed for each brand and model of freezer 1300. In certain embodiments, a baseline may be developed from one or more devices 1300 that are known to be performing nominally. However, baseline performance can be obtained without using a known optimally performing device 1300. Over time, and with a sufficient population of devices, a baseline may be extracted by identifying levels of performance (e.g. levels A, B, C E and F discussed herein) within the population of devices. Levels of performance may be assigned according to manufacturer specifications, user requirements, standards set by power companies or utility commissions, etc. Levels of performance may be used to determine eligibility for energy conservation rebates and the like and/or to identify candidates for replacement.

Baseline characteristics may be modified over time to reflect actual performance measurements that better reflect typical performance of a device 1300 while in use. In use, performance of device 1300 may be affected by the volume of materials stored in compartment 1308, by the arrangement of stored materials and by the shape of packaging of stored materials. Performance of device 1300 may also be affected by door openings, vibrations, changes in room temperature, and so on. As noted herein, it is often desirable to measure performance of device 1300 at times when human interactions are minimized, for example, early morning or late evening. However, measurements taken at other times may be useful determining other performance characteristics, such as the time and energy required to restore operating temperatures after a disruption or discontinuity, such as an opened door. These other performance characteristics may useful in determining which type of device 1300 should be used for long-term storage and which device 1300 should be used when subject to frequent access.

It is to be expected that the performance characteristics of a refrigerator or freezer change over time, although such changes may be so gradual as to escape detection in conventional systems. In certain embodiments of the present invention, more recent characteristics, including temperature and electrical current cycles, may be compared with previously obtained baseline characteristics for a device 1300. Changes detected over prolonged periods of time can be correlated with known patterns of change that are predictive of component or system failure, or predictive of performance degradation. In some instances, changes can simply indicate a need for maintenance. For example, a shortening of the period temperature cycle may indicate any of a number of conditions that cause the compressor to be active more frequently. However, rate of change of the period, step changes in the rate of change of the period, consistency or rate of change of the rate of change in period and changes in duty cycle (percentage of time compressor is turned on in a cycle) can provide additional data that may be used to diagnose the condition of the cooling system 1300 and predict failure or loss of efficiency.

As discussed herein, performance characteristics are typically maintained for a variety of different types of refrigerators and freezers 1300. Information derived from temperature and cooling cycles can be used to evaluate performance of different types of devices 1300. For example, a metric can be developed that rates energy efficiency for different makes and models of devices used for refrigeration or freezing. In one example, energy efficiency may be rated as the cubic feet that can be maintained at a specified temperature or temperature range for each kilowatt-hour of energy expended. This metric permits evaluation of devices that have different compartment volumes, different compartment geometries, different shelf configurations, different cooling capacities, etc. Performance characteristics gathered in situ and real time may be used to evaluate performance of previously unseen devices 1300 and to rate such performance against other similar or dissimilar devices. Such evaluations and ratings may be used to recommend to operators whether the device 1300 should be replaced and may be used by utilities to determine eligibility for rebates.

Certain embodiments of the invention provide systems and methods for monitoring the operational health of a refrigeration system. Certain embodiments comprise a sensor operable to measure temperature within a compartment of the refrigeration system. Certain embodiments comprise a control processor in communication with the sensor and configured to receive a series of periodic temperature measurements from the sensor. In certain embodiments, the control processor is operable to communicate a sequence of temperature samples to a monitoring system that characterizes one or more operational aspects of the refrigeration system based on the sequence of temperature samples. In certain embodiments, each temperature sample comprises at least one of the series of periodic temperature measurements and information indicative of a corresponding time of measurement. In certain embodiments, the monitoring system is configured to predict operational dysfunctions of the refrigeration system based on an analysis of the one or more characterized operational aspects.

In certain embodiments, the characterized operational aspects comprise a temperature cycle measured within the compartment of the refrigeration system. In certain embodiments, the analysis of the characterized operational aspects includes a comparison of the temperature cycle with one or more baseline temperature cycles previously obtained from the refrigeration system. In certain embodiments, the analysis of the characterized operational aspects includes a comparison of the temperature cycle with one or more baseline temperature cycles obtained from an optimally performing refrigeration system. In certain embodiments, the analysis of the temperature cycles includes a statistical analysis of the temperature cycle. In certain embodiments, the analysis of the temperature cycles includes a frequency-domain analysis of the temperature cycle. In certain embodiments, the analysis of the temperature cycles includes a pattern analysis of the temperature cycle.

In certain embodiments, the characterized operational aspects comprise a temperature cycle and a cycle of estimated electrical current consumed by the refrigeration system. In certain embodiments, the analysis of the characterized operational aspects includes estimating energy efficiency of the refrigeration system based on the estimated electrical current consumed by the refrigeration system. In certain embodiments, the current usage is calculated by cross-correlating a signal representative of estimated operating current of the refrigeration system with a signal representative of temperature measured within the compartment of the refrigeration system. Certain embodiments comprise a current transducer configured to measure current flow in an electrical circuit providing power to the refrigeration system. In certain embodiments, the characterized operational aspects comprise a temperature cycle and a cycle representing electrical current consumed by the refrigeration system. In certain embodiments, the analysis of the characterized operational aspects includes calculating energy efficiency of the refrigeration system based on the electrical current consumed by the refrigeration system. In certain embodiments, the electrical circuit provides power to a plurality of refrigeration systems. In certain embodiments, the monitor attributes a portion of the current flow to a selected refrigeration system based on an analysis of temperature cycles corresponding to the selected refrigeration system.

In certain embodiments, the monitor generates alerts in response to the identified dysfunctions. In certain embodiments, the identified dysfunctions including one or more of a temperature transition beyond nominal operating range, power usage beyond nominal operating ranges and a predicted failure of the refrigeration system. In certain embodiments, the characterized operational aspects comprise a temperature signal representative of the temperature within the compartment and a current signal representative of estimated electrical current consumed by the refrigeration system. In certain embodiments, the analysis of the characterized operational aspects includes an estimate of energy efficiency of the refrigeration system based on the estimated electrical current signal. In certain embodiments, the electrical current usage is calculated by cross-correlating the current signal with the temperature signal.

Certain embodiments comprise a current transducer configured to measure current flow in an electrical circuit providing power to the refrigeration system. In certain embodiments, the characterized operational aspects comprise a temperature signal and a signal representing electrical current consumed by the refrigeration system. In certain embodiments, the analysis of the characterized operational aspects includes calculating energy efficiency of the refrigeration system based on the electrical current signal. In certain embodiments, the electrical circuit provides power to a plurality of refrigeration systems, and wherein the monitor attributes a portion of the current flow to a selected refrigeration system based on a correlation of the temperature cycle with the current signal. In certain embodiments, the monitor generates alerts in response to the identified dysfunctions. In certain embodiments, the identified dysfunctions include one or more of a temperature transition beyond nominal operating range, power usage beyond nominal operating ranges and a predicted failure of the refrigeration system.

Certain embodiments of the invention provide methods for monitoring operational efficiency of a refrigeration system. Certain embodiments comprise generating a characteristic representing a time sequence of temperatures measured within a compartment of a refrigeration system. Certain embodiments comprise identifying differences between the characteristic and one or more baseline characteristics. In certain embodiments, the one or more baseline characteristics include at least one characteristic obtained from a nominally operating refrigeration system. Certain embodiments comprise determining one or more dysfunctions of a thermodynamic cycle based on the differences. In certain embodiments, the one or more dysfunctions includes a loss of energy efficiency, measured with respect to a baseline energy efficiency associated with the one or more baseline characteristics.

In certain embodiments, the one or more baselines include a previously obtained characteristic representing a time sequence of temperatures measured within a compartment of a refrigeration system. In certain embodiments, energy efficiency is measured as volume cooled for each unit of energy expended by the refrigeration system. In certain embodiments, the one or more dysfunctions include a predicted dysfunction, and further comprising identifying a corrective action to avert the predicted dysfunction. Certain embodiments comprise measuring electrical current in a power line that supplies the refrigeration system. In certain embodiments, measuring the electrical current in the power line includes determining the contribution of electrical current in the power line attributable to electrical current drawn by the refrigeration system. In certain embodiments, determining the contribution of electrical current attributable to the refrigeration system includes correlating changes in temperature of a storage compartment of the refrigeration system with variations of current measured in the power line.

Certain embodiments of the invention provide systems and methods for monitoring operational efficiency of a refrigeration system. Certain embodiments comprise a temperature sensor operable to measure temperature within a refrigerated compartment of the refrigeration system. Certain embodiments comprise a remote probe that samples temperature measurements provided at a configurable rate by the temperature sensor. Certain embodiments comprise a processor that generates a characteristic based on the sampled temperature measurements. In certain embodiments, the characteristic represents variations of temperature with time. In certain embodiments, the characteristic has a period, a maximum temperature and a minimum temperature. In certain embodiments, the processor is configured to identify operational inefficiencies of the refrigeration by comparing elements of the characteristic to elements of a plurality of baseline characteristics derived from one or more similar refrigeration systems.

In certain embodiments, the processor predicts failure of a component of the refrigeration system by identifying one or more differences between the elements of the characteristic and the elements of the plurality of baseline characteristics. Certain embodiments comprise a current transducer configured to measure current flow in an electrical circuit providing power to the refrigeration system. In certain embodiments, the processor generates a second characteristic representing electrical current consumed by the refrigeration system. In certain embodiments, the processor identifies a decline in energy efficiency of the refrigeration system over time. In certain embodiments, energy efficiency is measured as volume cooled for each unit of energy expended by the refrigeration system. In certain embodiments, the processor may identify certain operational inefficiencies of the refrigeration by correlating elements of the characteristic with elements of a plurality of baseline characteristics derived from one or more similar refrigeration systems.

Certain embodiments of the invention provide systems and methods for monitoring the state of health of a refrigeration unit, such as a freezer, and inferring compressor performance by analysis of indirect temperature and current readings. A comprehensive monitoring unit may be comprised of a temperature sensor, accelerometer, circuitry, ammeter, magnetometer, integrated transceiver, current transducer, and additional attached digital input devices. Readings from a monitoring unit can be transmitted to an application server. In some of these embodiments, an application server may use a statistical model to perform signal analysis on temperature and current readings.

Certain embodiments of the invention provide systems and methods of monitoring operational efficiency of a refrigeration system. Some of these embodiments comprise obtaining a characteristic representing a time sequence of temperatures measured within a compartment of a refrigeration system. Some of these embodiments comprise identifying differences between the characteristic and one or more baseline characteristics. In some of these embodiments, the baseline characteristics include at least one characteristic obtained from a nominally operating refrigeration system. Some of these embodiments comprise determining one or more dysfunctions of a thermodynamic cycle based on the differences. Some of these embodiments comprise identifying a corrective action to optimize the operational efficiency of the refrigeration system.

Certain embodiments of the invention provide systems and methods for monitoring the operational health of a refrigeration unit. Some of these embodiments comprise a sensor configured to measure temperature within a compartment of the refrigeration unit. Some of these embodiments comprise a control processor in communication with the sensor and configured to receive periodic temperature measurements from the sensor. Some of these embodiments comprise data storage that maintains a history of temperatures comprising at least one temperature measurement obtained from the sensor. In some of these embodiments, the data storage further maintains information that identifies a time of measurement for each of the temperature measurements. In some of these embodiments, the control processor transmits the history of temperatures to a monitor that is configured to identify dysfunctions of the refrigeration unit based on analysis of a temperature cycle within the refrigeration unit.

In some of these embodiments, the analysis of the temperature cycles includes a comparison of the temperature cycle with one or more baseline temperature cycles obtained from a nominally performing refrigeration unit. In some of these embodiments, the analysis of the temperature cycles includes a comparison of the temperature cycle with one or more baseline temperature cycles obtained from an optimally performing refrigeration unit. Comparisons may be used to identify underlying patterns or cycles and other cycles or asymmetries that can be indicative of problems, inefficiencies, component malfunction or other dysfunctions that cause or lead to inefficiency and/or system failure. In some of these embodiments, the analysis of the temperature cycles includes a statistical analysis of the temperature cycle. For example, statistical analysis may be used to filter raw data to identify and exclude anomalous measurements and/or discontinuities, such as elevated temperature and recovery cycles associated with a door opening event. In some of these embodiments, the analysis of the temperature cycles includes a frequency analysis of the temperature cycle. Frequency analysis may be used to calculate a fundamental frequency of the temperature cycle that can be used to match an electrical current contribution to the refrigeration system. Frequency analysis may be used to obtain a transform that is used to characterize the cooling cycle of the refrigeration system. In some of these embodiments, the analysis of the temperature cycles includes a pattern analysis of the temperature cycle.

In some of these embodiments, the monitor estimates power usage of the refrigeration unit based on characteristics of the temperature cycle and current usage of the refrigeration unit. In some of these embodiments, the characteristics of the temperature cycle identify when the refrigeration unit is actively cooling. In some of these embodiments, the current usage is calculated based on estimated operating current of the refrigeration unit when the refrigeration unit is active.

Some of these embodiments comprise a current transducer configured to measure current flow in an electrical circuit providing power to the refrigeration unit. In some of these embodiments, the monitor calculates power usage of the refrigeration unit based on characteristics of the temperature cycle and the measured current flow. In some of these embodiments, the electrical circuit provides power to a plurality of refrigeration units. In some of these embodiments, the monitor attributes a portion of the current flow to one or more selected refrigeration units based on an analysis of characteristics of temperature cycles of the selected refrigeration units.

Some of these embodiments comprise a transducer and/or an accelerometer configured to identify motion, direction and orientation of the refrigeration unit. In some of these embodiments, the accelerometer detects vibration attributable to start up and shut down of the refrigeration unit. In some of these embodiments, a magnetometer indicates the orientation of a freezer relative to a wall or structure. In some of these embodiments, the monitor calculates power usage of the refrigeration unit based on the occurrence of vibration and current usage of the refrigeration unit. In some of these embodiments, the monitor generates alerts in response to the identified dysfunctions. In some of these embodiments, the identified dysfunctions include temperature transitions beyond nominal operating ranges. In some of these embodiments, the identified dysfunctions include power usage beyond nominal operating ranges. In some of these embodiments, the history of temperature is transmitted wirelessly.

Certain embodiments of the invention provide systems and methods for monitoring operational efficiency of a refrigeration system. Some of these embodiments comprise a temperature sensor provided within a refrigerated compartment of the refrigeration system. Some of these embodiments comprise a remote probe that records temperature measurements from the temperature sensor at a configurable rate. Some of these embodiments comprise a processor that extracts a characteristic from the temperature measurements. In some of these embodiments, the characteristic represents variations of temperature with time. In some of these embodiments, the characteristic having a period, a maximum temperature and a minimum temperature. In some of these embodiments, the processor is configured to identify operational inefficiencies of the refrigeration by comparing elements of the characteristic to elements of a plurality of baseline characteristics derived from one or more similar refrigeration systems.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The word "exemplary" as used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other. For instance, a first die may be coupled to a second die in a package even though the first die is never directly physically in contact with the second die.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A method of controlling a network of cooling systems, comprising:
   receiving first measurements captured by sensors in a plurality of cooling devices, including sensors configured to measure vibration, temperature or electrical current during each cooling cycle of a corresponding cooling device at a frequency calculated to determine a fundamental frequency of the cooling cycle of a corresponding cooling device;
   identifying a first feature of the first measurements that indicates (i) onset of failure of a first cooling device when the first feature comprises a failure pattern identified in measurements obtained by at least one sensor that is associated with the first cooling device, or (ii) instability in a component of the first cooling device;
   initiating a service or repair procedure configured to prevent failure of the first cooling device;

receiving second measurements captured by the sensors in the plurality of cooling devices after the first cooling device has been repaired; and determining whether a second feature present in the second measurements indicates that the first cooling device is operating at or above an optimal or nominal performance level, the second feature corresponding to a healthy pattern identified in the first measurements and the second measurements, wherein the healthy pattern is associated with one or more other cooling devices operating at or above the optimal or nominal performance level.

2. The method of claim 1, wherein the first feature comprises cycle variance corresponding to variance in duration of cooling cycles of the first cooling device.

3. The method of claim 1, wherein the failure pattern comprises a pattern of change in cycles of temperature or electrical current associated with the first cooling device.

4. The method of claim 1, wherein the sensors comprise a vibration sensor configured to detect vibration of a compressor in the first cooling device that indicates that the compressor is cycling on or cycling off.

5. The method of claim 1, wherein the healthy pattern corresponds to a pattern identified in prior measurements captured over a finite period of time from a group of same-type cooling devices that are running at or above the optimal or nominal performance level.

6. The method of claim 1, wherein initiating the service or repair procedure comprises:
identifying the service or repair procedure based on the first measurements; and
dispatching a repair technician to execute the service or repair procedure,
wherein the service or repair procedure identifies one or more actions to be taken or omitted and timing of the actions to be taken or omitted by the repair technician.

7. The method of claim 1, wherein a smart sensor in the first cooling device is configured to communicate statistical information related to performance or energy consumption by the first cooling device based on an analysis of measurements captured by the smart sensor.

8. The method of claim 1, wherein identifying the first feature comprises:
analyzing a plurality of sensor streams captured over a finite period of time, each sensor stream comprising measurements obtained from a sensor corresponding to one of the plurality of cooling devices.

9. The method of claim 1, wherein the fundamental frequency of the cooling cycle of the corresponding cooling device corresponds to a fundamental frequency of a temperature cycle within the corresponding cooling device.

10. The method of claim 1, further comprising:
scoring or classifying effectiveness of the service or repair procedure based on performance level of the first cooling device indicated by the second measurements.

11. The method of claim 1, further comprising:
scoring or classifying effectiveness of the service or repair procedure based on energy consumption of the first cooling device indicated by the second measurements.

12. The method of claim 1, further comprising:
scoring or classifying effectiveness of the service or repair procedure based on organization, company or and individual selected to perform the service or repair procedure.

13. The method of claim 1, further comprising:
scoring the first cooling device based on make, model and manufacturer.

14. The method of claim 1, further comprising:
scoring the first cooling device based on energy efficiency.

15. The method of claim 1, further comprising:
scoring the first cooling device based on on-time of a compressor in the first cooling device.

16. The method of claim 1, further comprising:
determining a population norm for a group of same-type cooling devices that includes the first cooling device using statistical analysis; and
benchmarking the first cooling device against the population norm to obtain a score for the first cooling device.

17. The method of claim 1, further comprising:
receiving third measurements captured by the sensors in the plurality of cooling devices after the first cooling device has been repaired; and
determining that the first cooling device is persistently operating at or above the optimal or nominal performance level when the second feature is present in the third measurements.

18. A non-transitory processor-readable storage medium having instructions stored thereon that, when executed by at least one processing circuit, cause the at least one processing circuit to:
receive first measurements captured by sensors in a plurality of cooling devices, including sensors configured to measure vibration, temperature or electrical current during each cooling cycle of a corresponding cooling device at a frequency calculated to determine a fundamental frequency of the cooling cycle of a corresponding cooling device;
identify a first feature of the first measurements that indicates (i) onset of failure of a first cooling device when the first feature comprises a failure pattern identified in measurements obtained by at least one sensor that is associated with the first cooling device, or (ii) instability in a component of the first cooling device;
initiate a service or repair procedure configured to prevent failure of the first cooling device;
receive second measurements captured by the sensors in the plurality of cooling devices after the first cooling device has been repaired; and
determine whether a second feature present in the second measurements indicates that the first cooling device is operating at or above an optimal or nominal performance level, the second feature corresponding to a healthy pattern identified in the first measurements and the second measurements, wherein the healthy pattern is associated with one or more other cooling devices operating at or above the optimal or nominal performance level.

* * * * *